United States Patent [19]

Asano et al.

[11] Patent Number: 5,323,039

[45] Date of Patent: Jun. 21, 1994

[54] NON-VOLATILE SEMICONDUCTOR MEMORY AND METHOD OF MANUFACTURING THE SAME

[75] Inventors: Masamichi Asano, Tokyo; Hiroshi Iwahashi, Yokohama; Ryouhei Kirisawa, Yokohama; Ryozo Nakayama, Yokohama; Satoshi Inoue; Riichiro Shirota, both of Kawasaki; Tetsuo Endoh; Fujio Masuoka, both of Yokohama, all of Japan

[73] Assignee: Kabushiki Kaisha Toshiba, Kawasaki, Japan

[21] Appl. No.: 499,342

[22] PCT Filed: Sep. 14, 1989

[86] PCT No.: PCT/JP89/00942

§ 371 Date: Jun. 21, 1990

§ 102(e) Date: Jun. 21, 1990

[87] PCT Pub. No.: WO90/04855

PCT Pub. Date: May 3, 1990

[30] Foreign Application Priority Data

Oct. 21, 1988 [JP] Japan .................. 63-265370
Aug. 30, 1989 [JP] Japan .................. 1-224006

[51] Int. Cl.⁵ .................................................. H01L 29/68
[52] U.S. Cl. ............................................. 257/315; 365/185
[58] Field of Search ................... 357/23.5, 23.14, 54; 365/185; 257/315

[56] References Cited

U.S. PATENT DOCUMENTS 4,962,481 10/1990 Choi et al. ........................ 357/23.5
5,017,980 5/1991 Gill et al. ......................... 357/23.5

FOREIGN PATENT DOCUMENTS 57-162370 10/1982 Japan .
58-190069 11/1983 Japan .
59-55071 3/1984 Japan .
62-54962 3/1987 Japan .

OTHER PUBLICATIONS

Y. Itoh, et al., "An Experimental 4Mb CMOS EEPROM with a NAND structured Cell," ISSCC89, 10.4, Feb. 1989, pp. 134-135.
M. Momodomi et al., "New Device Technologies for 5V-Only 4Mb EEPROM with NAND structure Cell," IEDM 88, 17.1, Dec. 1988, pp. 412-415.
R. Shirota et al., "A New Cell for Ultra High Density 5V-Only EEPROMs," VLSI Technology Digest of Technical Papers, May, 1988, pp. 33-34.
R. Stewart et al., "A High Density EPROM Cell and Array", Symposium on VLSI Technology Digest of Technical Papers; May 1986, pp. 89-90.
M. Momodomi et al., "A High Density NANS EEPROM with Block-Page Programming for Microcomputer Applications," May, 1989; CICC89, pp. 10.1.1-10.1.4.

Primary Examiner—Sara W. Crane
Attorney, Agent, or Firm—Foley & Lardner

[57] ABSTRACT

The present invention relates to a non-volatile semiconductor memory having non-volatile memory cells capable of electrically erasing and writing data. Each memory cell has a floating gate formed on the surface of the semiconductor substrate above the channel region, and a control gate. The floating gate partially covers the channel region. Each memory cell is thereby constructed of a parallel connection of a floating gate transistor and an enhancement type transistor. The floating gate transistor is displaced in one of the widthwise directions of the channel region, or partially covers only the central portion of the channel region in the widthwise direction thereof. A plurality of memory cells are connected in series to constitute a basic block. Adjacent basic blocks are separated by an enhancement type MOS transistor. In this memory, a memory cell (floating gate) and an enhancement type MOS transistor (gate) are formed in self alignment with each other using the same mask. In addition, in this memory, a control gate and a floating gate are formed in self alignment with each other using the same mask.

8 Claims, 24 Drawing Sheets

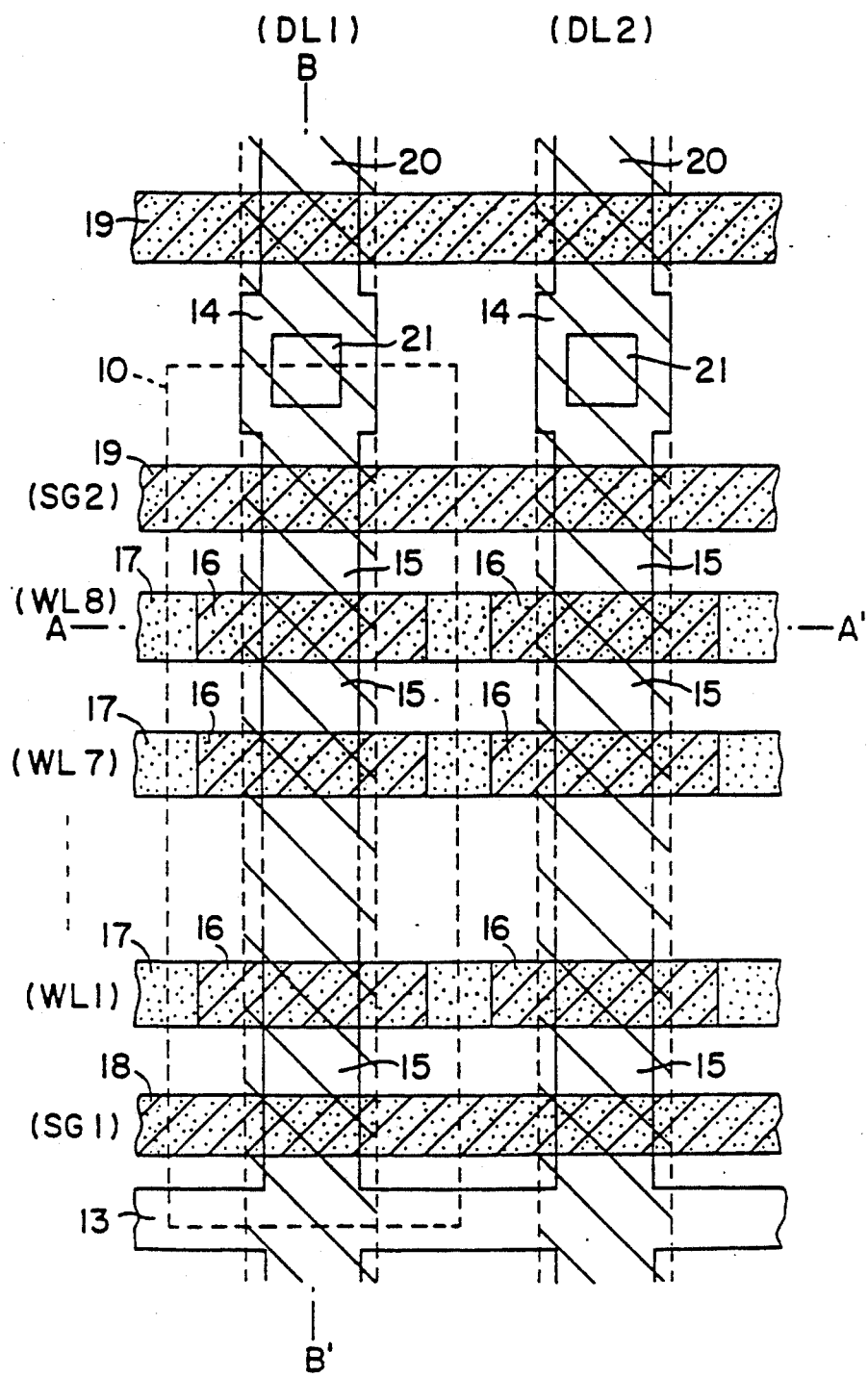
F I G. 1A

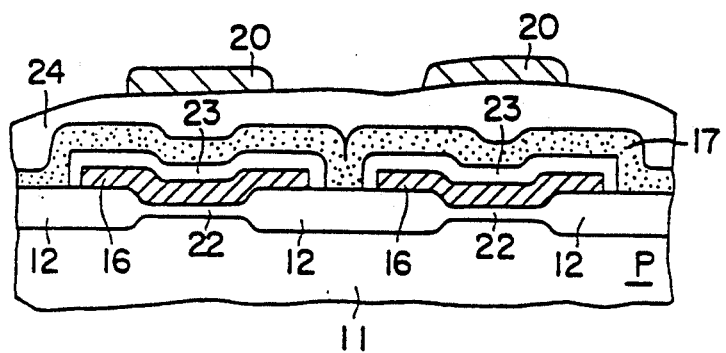
F I G. 1B
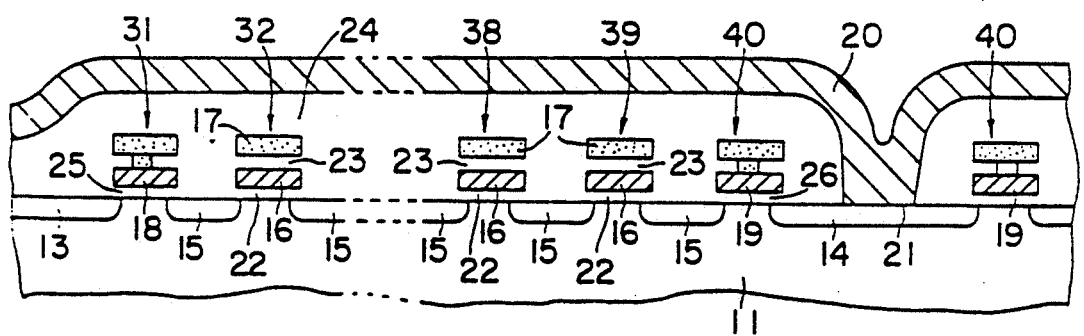
F I G. 1C

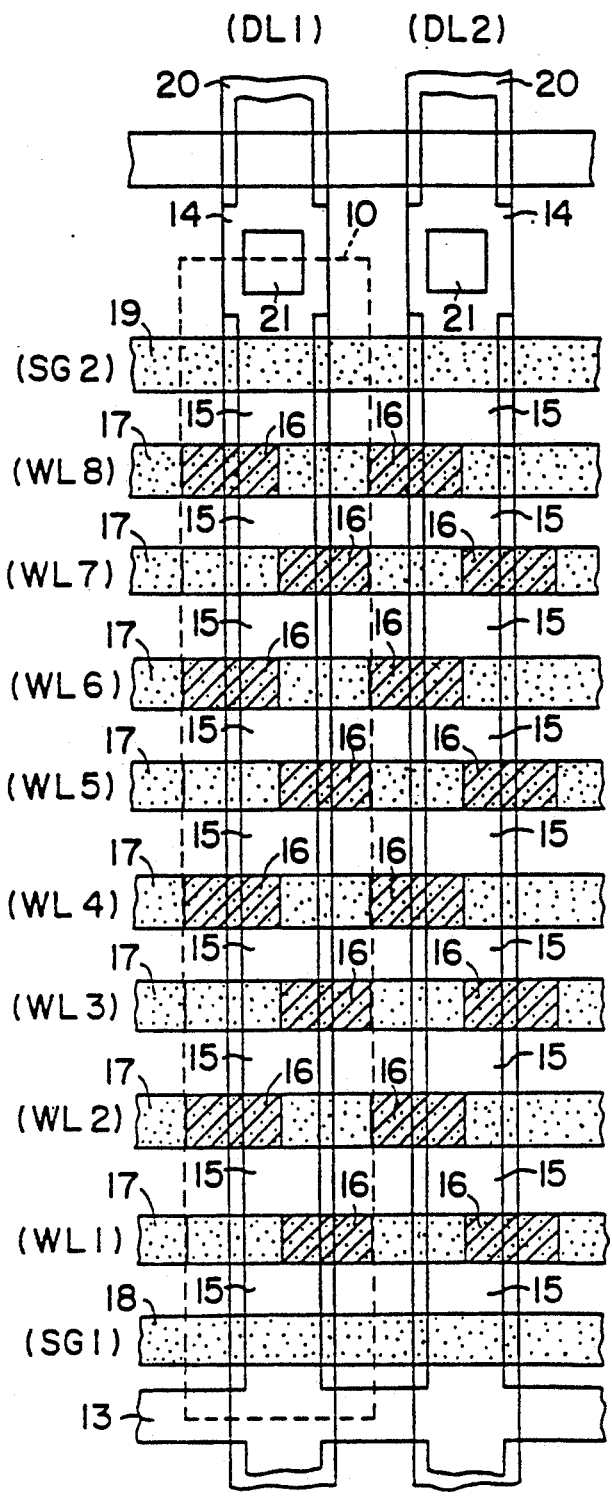
F I G. 12

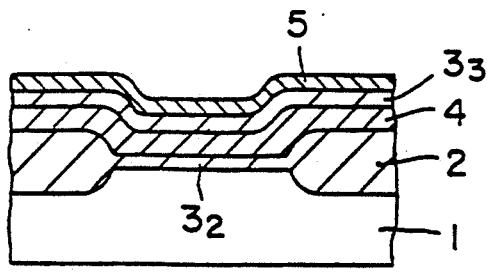
F I G. 20 A
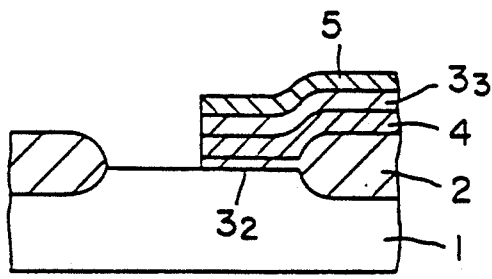
F I G. 20 B
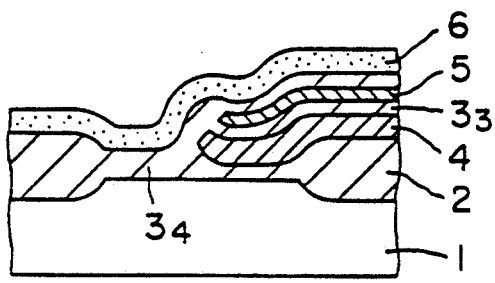
F I G. 20 C
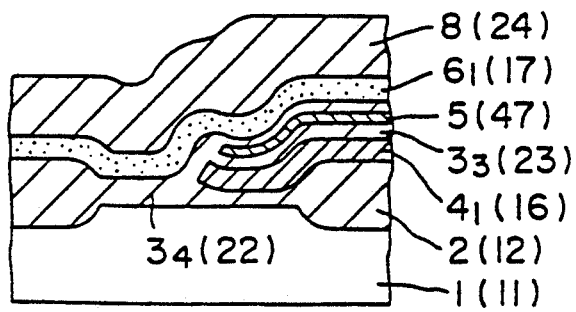
F I G. 20 D

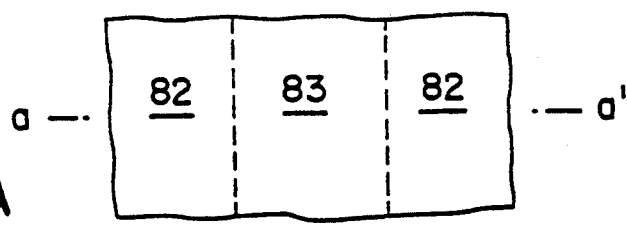
FIG. 26A
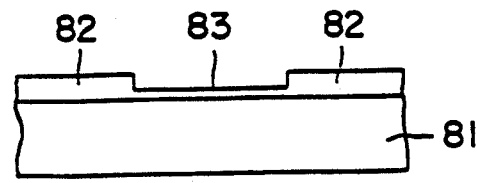
FIG. 26B
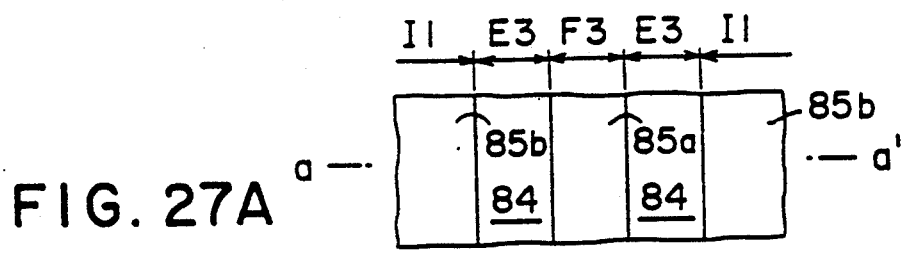
FIG. 27A
FIG. 27B
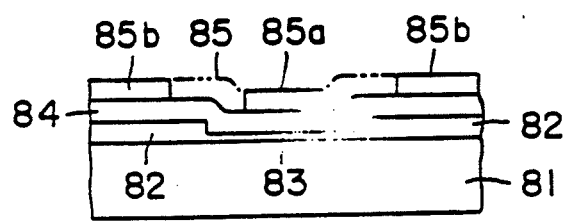
FIG. 28A
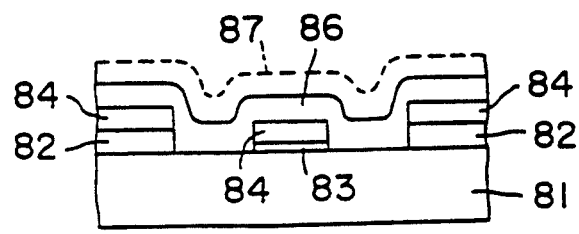
FIG. 28B

NON-VOLATILE SEMICONDUCTOR MEMORY AND METHOD OF MANUFACTURING THE SAME

TECHNICAL FIELD

The present invention relates to a non-volatile semiconductor memory having non-volatile memory cells capable of electrically erasing and writing data.

BACKGROUND ART

A ROM, the storage contents of memory cells of which can be electrically erased and changed, is known as an EEPROM (electrically erasable programmable ROM). When compared with an EPROM, EEPROM can be used more easily since data are erased with electric signals while being mounted on a circuit board, since the demands for use with various control circuits, memory cards or the like are rapidly increasing. A large scale EEPROM in particular which is used when changing data in a floppy disk has been recently desired.

FIGS. 1A to 1C show the structure of the memory array of a conventional NAND type EEPROM suitable for large scale integration. FIG. 1A is a plane view of the pattern, FIG. 1B is a cross section along line A—A' of FIG. 1A, and FIG. 1C is a cross section along line B—B' of FIG. 1A. Referring to FIG. 1A, a portion enclosed by a broken line and indicated at 10 represents one NAND basic block. As understood from FIG. 1B, this NAND basic block 10 is partitioned from other NAND basic blocks disposed in the right/left direction as viewed in FIG. 1B by field oxide films 12, 12, . . . . The vertical cross section of the NAND basic block 10 is as shown in FIG. 1C. Specifically, referring to FIG. 1C in particular, reference numeral 11 represents a p-type silicon semiconductor substrate, 13 a common source region made of an n+ diffusion layer and shared by respective basic blocks 10, 14 a drain region of the NAND basic block 10 which region is also made of an n+ diffusion layer, 15, 15, . . . source/drain regions of memory cells within the NAND basic block 10 which regions are made of n+ diffusion layers, 16, 16, . . . floating gates made of a first polysilicon layer, 17, 17, . . . control gates made of a second polysilicon layer, 18 a first select gate constructed by electrically connecting together the first and second polysilicon layers, 19 a second select gate constructed by electrically connecting together the first and second polysilicon layers, 20 a data line, 21 a contact connecting the drain region 14 and the data line 20, 22 a gate oxide film formed between the floating gate 16 and the substrate 11 and having a thickness of, e.g., about 100 Å, 23 a gate insulating film formed between the floating gate 16 and the control gate 17 for which the film has a thickness of about 300 Å and a three-layered structure of, e.g., ONO (oxide-nitride-oxide), 24 an insulating oxide film, and 25 and 26 gate oxide films formed between the substrate 11 and the first and second select gates 18 and 19, respectively, and having a thickness of, e.g., about 400 Å. This gate oxide film 25 may be of the ONO three-layered structure which is formed at the time of forming the gate oxide film 23. In this case, the select gate transistors 18 and 19 are made of only the second polysilicon layer without using the first polysilicon layer. As seen from FIG. 1C in particular, each NAND basic block 10 is formed with ten transistors (memory cells and select gate transistors) 31 to 40 which will be described later in detail. The transistors 31 to 40 are turned on and off by means of gates 17 to 19 of respective channels. The on/off of the transistors 32 to 39, however, is controlled in dependence upon whether each floating gate 16 has electrons or holes.

Each floating gate 16 stores "1" or "0" in dependence on whether it has electrons or holes.

The number of control gates 17, 17, . . . provided for each NAND basic block 10 is, for example, eight. Each control gate is formed continuously to cover a plurality of floating gates 16, 16, . . . positioned under the control gate. Namely, as seen from FIGS. 1A and 1B in particular, the width (width in the up/down direction as viewed in FIG. 1A) of each floating gate 16, 16, . . . is the same as that of each control gate 17, 17, . . . , and the length (length in the right/left direction as viewed in FIG. 1A) of each floating gate 16, 16, . . . is formed shorter than the width of each NAND basic block. The memory cell array is constructed by disposing the NAND basic blocks 10 in matrix in the up/down right/left directions as viewed in FIG. 1A.

The equivalent circuit of the NAND basic block 10 is shown in FIG. 2. In FIG. 2, two NAND basic blocks 10 and 10 disposed right and left are shown. As seen from FIG. 2, the equivalent circuit of each NAND basic block 10 is constructed such that between the source 13 and the data line 20 (DL1, DL2),.the select gate transistor 31, eight memory cells 32 to 39, and select gate transistor 40 are serially connected. The transistors 31 and 40 are inputted with select gate signals SG1 and SG2, respectively, and word lines WL1 to WL8 are connected to the control gates 17 of the memory cells 32 to 39.

The data erase/write operation of eight memory cells 32 to 39 each made of a floating gate transistor will be described hereinbelow.

As understood from FIG. 3A, data are erased by applying a high voltage, e.g., 15 V to the control gate 17 and connecting the source 15 and drain 15 to a 0 V ground potential. By applying a high voltage to the control gate 17, the control gate 17 and the floating gate 16 are electrostatically coupled so that the potential of the floating gate 16 rises and electrons are injected from the source 15 or drain 15 into the floating gate 16 via the gate oxide film 22. This is called an erase state, and the stored data at this state is defined as a "1" level. The threshold voltage of the memory cell at this state becomes about 2 to 3 V as shown in the characteristic curves of FIG. 4.

As understood from FIG. 3B, data are written by setting the control gate 17 at 0 V, making the source 15 in an open state, and applying a high voltage to the drain 15. In this case, electrons are emitted to the drain 15 from the floating gate 16, and the threshold voltage of the memory cell becomes about −5 V as shown in the characteristic curves of FIG. 4. The stored data at this state are defined as a "0" level.

The operation of the NAND basic block 10 show in. FIGS. 2 and 1A will be described with reference to Table 1.

TABLE 1

|  | ERASE | ORDER OF WRITING DATA | | | | | | | | READ (EXAMPLE) |
|---|---|---|---|---|---|---|---|---|---|---|
|  |  | CELL 1 (32) | CELL 2 (33) | CELL 3 (34) | CELL 4 (35) | CELL 5 (36) | CELL 6 (37) | CELL 7 (38) | CELL 8 (39) |  |
| SG2 | 15V | 20V | 20V | 20V | 20V | 20V | 20V | 20V | 20V | 5V |
| WL8 | 15 | 20 | 20 | 20 | 20 | 20 | 20 | 20 | 0 | 5 |
| WL7 | 15 | 20 | 20 | 20 | 20 | 20 | 20 | 0 | 0 | 5 |
| WL6 | 15 | 20 | 20 | 20 | 20 | 20 | 0 | 0 | 0 | 5 |
| WL5 | 15 | 20 | 20 | 20 | 20 | 0 | 0 | 0 | 0 | 5 |
| WL4 | 15 | 20 | 20 | 20 | 0 | 0 | 0 | 0 | 0 | 5 |
| WL3 | 15 | 20 | 20 | 0 | 0 | 0 | 0 | 0 | 0 | 5 |
| WL2 | 15 | 20 | 0 | 0 | 0 | 0 | 0 | 0 | 0 | 5 |
| WL1 | 15 | 0 | 0 | 0 | 0 | 0 | 0 | 0 | 0 | 0 |
| SG1 | 5 | 0 | 0 | 0 | 0 | 0 | 0 | 0 | 0 | 5 |
| DL1 | 0 | 20 | 20 | 20 | 20 | 20 | 20 | 20 | 20 | 1 |
| DL2 | 0 | 10 | 10 | 10 | 10 | 10 | 10 | 10 | 10 | 0 |

Data are erased by setting the data line DL1, DL2 to 0 V, SG1 to 5 V, SG2 to 15 V, and word lines WL1 to WL8 to 15 V. In this state, all the drains and sources of the memory cells 32 to 39 become 0 V so that all the data in the memory cells 32 to 39 are erased collectively.

Data are written sequentially and selectively starting from the memory cell 32 (cell 1) nearest to the select gate transistor 31. First, in order to write data in the cell 32, SG1 is set to 0 V, data line DL1 to 20 V, DL2 to 10 V, and SG2 to 20 V. Next, word line WL1 is set to 0 V, and all the other word lines WL2 to WL8 to 20 V so that the memory cell 32 is selected and data are written therein. The threshold voltage of the memory cell whose data have been erased is about 3 V, whereas that of the memory cells 33 to 39 (cell 2 to cell 8) with a high voltage being applied in a write state is about 5 V while taking the substrate effect into consideration. As a result, the drain of the memory cell 32 is applied with (gate voltage of the memory cell 33)—(threshold voltage of the erased memory cell)=(20 V−5 V)=15 V, so that electrons are emitted from the floating gate to the drain via the gate oxide film (indicated at 22 in FIG. 1B) having a thickness of 100 Å, in other words, data are written in the memory cell 32.

In writing data in the next memory cell 33, word lines WL1 and WL2 are set to 0 V, and all the other word lines WL3 to WL8 are set to 20 V. In a similar manner, data writing is sequentially performed up to the memory cell 39 with voltages being set as shown in Table 1.

If data are not written in a selected memory cell, i.e., if the "1" level data are remained unchanged, data line DL1 is applied with 0 V or 10 V instead of 20 V. In this case, a voltage is not applied between the floating gate and the drain, or an applied voltage is small, so that data are not written.

As described above, data writing is sequentially performed for eight memory cells starting from the memory cell 32 on the source side. The reason for this is that if data are written into a cell without using this data writing order, a high voltage (20 V) is applied to the word lines of the other cells already written, and 0 V is applied to the drain, to thereby produce an erase state and erase the data in the other cells. By using the above-described data writing order, it is possible to prevent the written data from being erased.

Furthermore, while a data erase/write operation is carried out for the block 10 on the data line DL1 side, the other data line DL2 is applied with about 10 V which is an intermediate voltage between the write and erase operations. This is carried out for preventing erroneous data erase/write relative to the memory cells connected to the data line DL2.

Furthermore, while one NAND basic block is selected and data are written, in the other NAND basic blocks connected to the block vertically (in the up-/down direction as viewed in FIG. 1A), SG2 is set to 0 V and the word lines WL1 to WL8 are set to 0 V so as to prevent erroneous data erase/write.

The data read operation from the NAND basic block is carried out in the following manner. For example, in FIG. 2, consider the case wherein data are read by selecting the memory cell 32 in the NAND basic block connected to the data lines DL1. In this case, as shown in Table 1, DL1 is set to 1 V, SG1 and SG2 to 5 V, the selected word line WL1 to 0 V, and the other word lines WL2 to WL8 to 5 V. The non-selected data line DL2 becomes a floating state, and takes approximately 0 V. If the stored data in the selected memory cell 32 are of the "1" level (threshold voltage of +3 V), the control gate voltage is 0 V so that it takes an off-state. As a result, in the selected NAND basic block 10, current will not flow between the data line DL1 and the ground potential so that the "1" level data are sensed with a sense amplifier (not shown) connected to the data line DL1. On the other hand, if the stored data in the selected memory cell 32 is of "0" level (threshold voltage of −5 V), the memory cell 32 takes an on-state even if the control gate voltage is 0 V. In this case, the control gate voltages of the other memory cells 33 to 39 are 5 V and these memory cells 33 to 39 take an on-state irrespective of the stored data. Therefore, in this basic block, current flows between the data line DL1 and the ground potential so that the "0" level data are sensed with the sense amplifier.

In a conventional memory having NAND basic blocks described above, memory cells can be disposed at the pitch of the word lines (control gates 17), and only a single contact 21 is used for a plurality (e.g., eight) of memory cells, allowing a larger number of memory cells per unit area and providing a structure suitable for miniaturizing a large capacity memory. A conventional memory, however, has the following problems.

A first problem is as follows. Since a NAND basic block has a NAND type cell structure with a plurality of memory cells connected in series, it is necessary for reading data from a selected memory cell to turn on other non-selected and erased memory cells. It becomes necessary to therefore turn them on by using a 5 V gate voltage and to maintain the threshold voltage smaller than or equal to about 3 V (at least smaller than or equal to 5 V). Similarly, it is also necessary to maintain the threshold voltage of the selected and erased memory cell larger than or equal to about 1 V (at least larger than or equal to 0 V). It is difficult however, to uniformly erase all memory cells of a large capacity memory of large scale such as 1 M bits or 4 M bits as variation will necessarily occur. If such variation causes the threshold voltage of even one erased memory cell to move out of the range from 0 V to 3 V, then the memory becomes a defective one. It is very difficult to design and manufacture a memory capable of uniformly and reliably erasing the data of all memory cells.

Apart from the above, in order to speed up the data read speed, it is necessary to make a larger current flow in a NAND basic block which includes a memory cell storing "0" level data. Also in this case, if the threshold voltage of a non-selected memory cell whose gate is applied with 5 V, is 3 V, it is not possible to make the on-current sufficiently large. For instance, in a NAND basic block designed on the basis of a 1 $\mu$m rule, a cell current only in the order of several $\mu$A flows during data reading, which is not suitable from the standpoint of increased speed.

A second problem of a conventional memory is the necessity of high voltage withstanding. During data writing into the memory cell 32 for example, the threshold voltage of the memory cells 33 to 39 is about 5 V so that a high voltage of 20 V becomes necessary to efficiently write data in the memory cell 32. For this reason, a sufficiently high voltage withstand is required for peripheral circuits, while posing another problem of lowering the reliability due to voltage stress applied to memory cells.

SUMMARY OF THE INVENTION

The present invention has been made in consideration of the above circumstances, and has as its object to provide a non-volatile semiconductor memory which has a high operation speed, can collectively and uniformly erase all memory cells reliably, and allows the use of low voltage during data writing.

Each memory cell is constructed by a parallel connection of a floating gate transistor and an enhancement type transistor. The threshold voltage of a floating gate transistor during an erase state, i.e., during a state wherein the floating gate traps or charges negative charges, is not lower than the threshold voltage of the enhancement type transistor. As a result, the threshold voltage of each memory cell during an erase state can be determined by the enhancement type transistor, and during the write state by the floating gate transistor.

Accordingly, even during the erase state, the cell current of a memory cell can take a large value because the threshold voltage of the enhancement type transistor is made low. Even if a non-selected memory cell within a basic block is in the erase state, the current flowing through the memory cell is made large, to thereby realize a high operation speed.

In addition, the threshold voltage during the erase state takes the threshold voltage of the enhancement type transistor, i.e., a predetermined constant threshold voltage, to thereby realize a uniform erase for all memory cells.

Furthermore, since the threshold voltage of a memory cell in the erase state is low, it is possible to turn on the memory cell at a low voltage. Accordingly, since a non-selected memory can turn on at a low voltage even in the erase state, data can be written in a selected memory cell.

BRIEF DESCRIPTION OF THE DRAWINGS

FIG. 1A is a plan view showing a pattern according to the background art;

FIG. 1B is a cross section along line A—A' of FIG. 1A;

FIG. 1C is a cross section along line B—B' of FIG. 1A;

FIG. 12 is a plan view of a pattern showing a fourth embodiment according to the present invention;

FIGS. 20A to 20D and FIGS. 21A to 21D are cross sections showing manufacturing steps of the ninth embodiment;

FIGS. 26A to 31C are cross sections showing manufacturing steps of a second manufacturing method of the tenth embodiment.

DESCRIPTION OF THE PREFERRED EMBODIMENTS

Figure 5A:
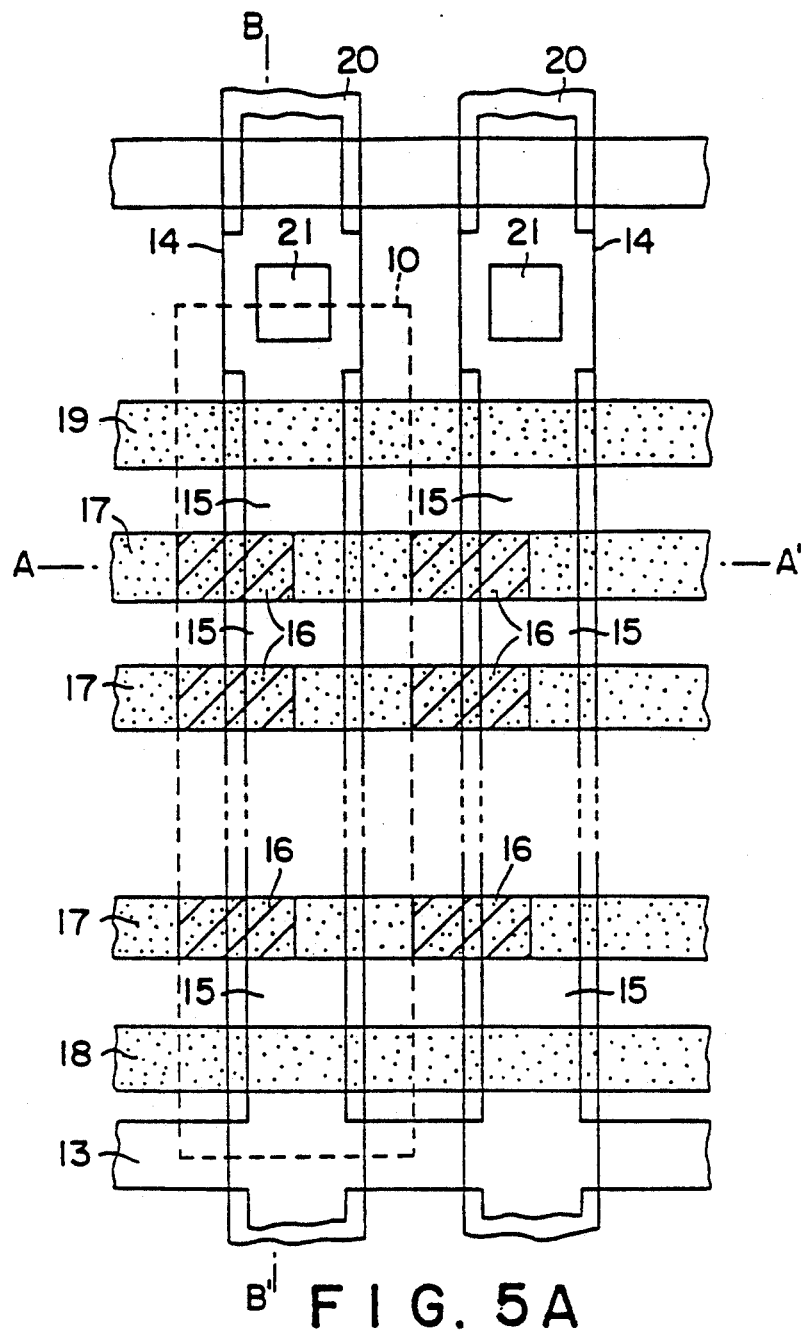
FIG. 5A is a plan view of a pattern showing a first embodiment according to the present invention.
Figure 5B:
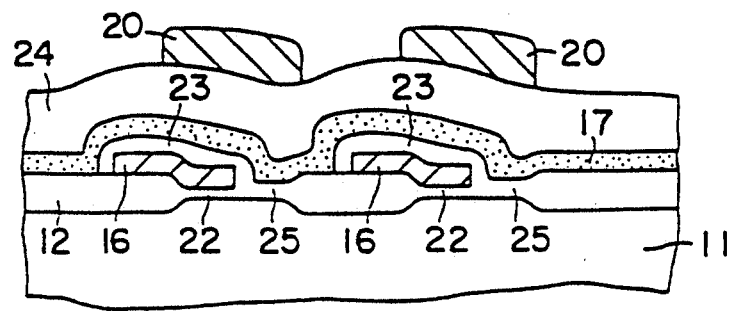
FIG. 5B is a cross section along line A—A' of FIG. 5A.

FIGS. 5A and 5B show the memory array of a NAND type EEPROM embodying the present invention, wherein FIG. 5A is a plan view of the pattern, and FIG. 5B is a cross section along line A—A' of FIG. 5A. In FIGS. 5A and 5B, similar constitutional elements to those shown in FIGS. 1A to 5B are represented by using identical reference numerals shown in FIGS. 1A to 1C. The device shown in FIGS. 5A and 5B is applied with the same voltages shown in Table 1 (although a write voltage value is small and an erase voltage value is large) to perform erase, write and read operations.

The different point of the embodiment shown in FIGS. 5A and 5B from the memory cell shown in FIGS. 1A to 1C is that, as understood from FIG. 5A in particular, each floating gate 16 is displaced left in the extending direction of a control gate 17. With such displacement arrangement, each floating gate 16 covers not all the area of each memory cell (32 to 39) but a partial area thereof. Consider the channel region of a memory cell (39) for example. At the partial area of the channel region, the floating gate 16 overlaps the control gate 17 to form a floating gate transistor (39a), whereas at the remaining area, only the control gate 17 is present to form an enhancement type transistor (39b). Each memory cell is therefore constructed of a parallel connection of the above-described two types of transistors. The equivalent circuit of each NAND basic block 10 shown in FIG. 5A is therefore represented as shown in FIG. 6.

Figure 6:
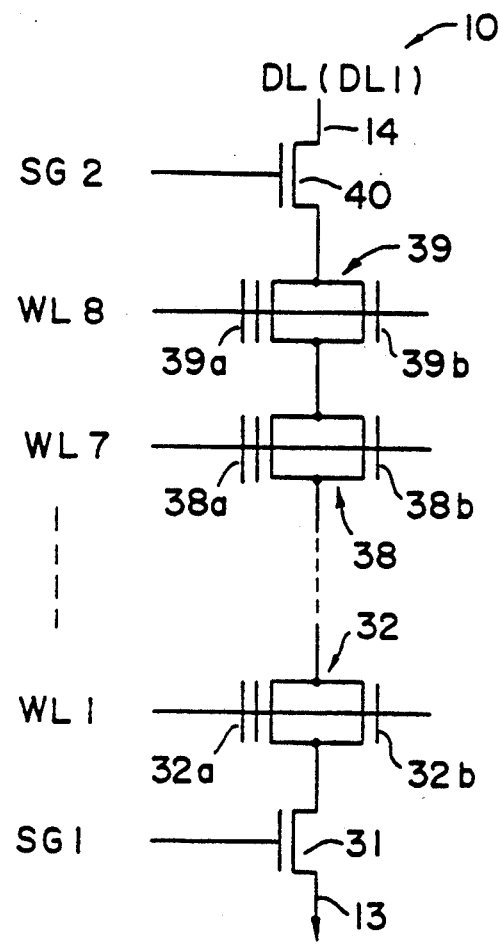
FIG. 6 is an equivalent circuit for FIG. 5A.

Next, the operation of eight memory cells 32 to 39 each constructed of a parallel connection of the floating gate transistor and enhancement type transistor as shown in FIG. 6, will be described with reference to the characteristic curves shown in FIG. 7. The curve (b) shown in FIG. 7 indicates the characteristic of a memory cell in an erase state. In the erase state, the threshold voltage of a floating transistor, e.g., transistor 32a shown in FIG. 6, is as high as about 5 V as shown by the curve (a) in FIG. 7. However, the threshold voltage of the enhancement type transistor 32b connected in parallel with the transistor 32a is 1 V as seen from the curve (b). As a result, the characteristic of the enhancement type transistor 32b becomes dominant as the characteristic of the memory cell 32, thus presenting the threshold voltage of 1 V. Similarly, as the characteristics of the other memory cells 33 to 39, the enhancement type transistors 33b to 39b become dominant.

Figure 7:
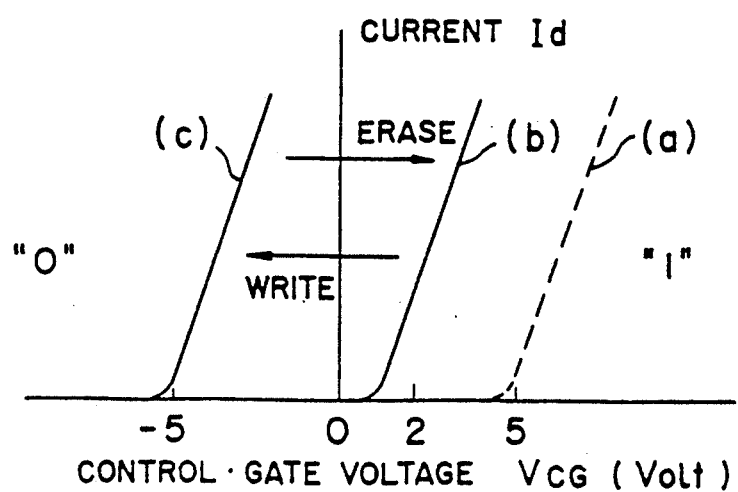
FIG. 7 shows the characteristic curves of the threshold voltage for FIG. 5A.

The curve (c) shown in FIG. 7 represents the characteristic of a memory cell in a write state. In this case the threshold voltage becomes about −5 V. Namely, although the threshold voltage of an enhancement type transistor (e.g., 32b) in the write state remains 1 V which is the same as the case of the erase state, the threshold voltage of a floating gate transistor (e.g., 32a) becomes about −5 V. As a result, the characteristic of a floating gate transistor becomes dominant as the characteristic of the memory cell, thereby presenting the threshold voltage of about −5 V.

In a memory cell constructed of a parallel connection of such two transistors, the threshold voltage in the erase state is determined by the enhancement type transistor. It is easy to design and manufacture enhancement type transistors having a threshold voltage of 1 V. In addition, the threshold voltage of floating gate transistors may take any value larger than or equal to 1 V (at least larger than or equal to 0 V), so that if data are erased sufficiently while considering threshold voltage variation, a large cell current can flow to thereby realize a stable characteristic.

The erase, write and read operations of the NAND basic block is the same as that described with Table 1. It is necessary for a conventional memory to set the threshold voltage within the range from 1 V to 3 V in the erase state. Therefore, too high a voltage cannot be applied to the word line. For this reason, a relatively low voltage 15 V is applied to slowly erase data and carefully move to a desired threshold voltage. In contrast, in the memory of this embodiment, the threshold voltage in the erase state is determined by the enhancement type transistor so that it is not necessary to consider to what degree the threshold voltage of the floating gate transistor moves in the erase state. A voltage higher than conventional, e.g. in the order of 17 V can therefore be applied to the word line to sufficiently erase data.

Furthermore, in writing data in a conventional memory, the threshold voltage of an erased memory cell rises to about 5 V so that it is necessary to apply a high voltage of 20 V to the control gate of a non-selected memory cell in order to apply 15 V to the drain of a selected memory cell. In contrast, in the case of this embodiment, the threshold voltage in the erase state is as low as 1 V, or about 2 V if the substrate effect is considered, so that a voltage about 17 V lower than conventionally applied, can be applied to the control gate of a non-selected memory cell in order to obtain a voltage 15 V as convent obtained at the drain of a selected memory cell.

Figure 8:
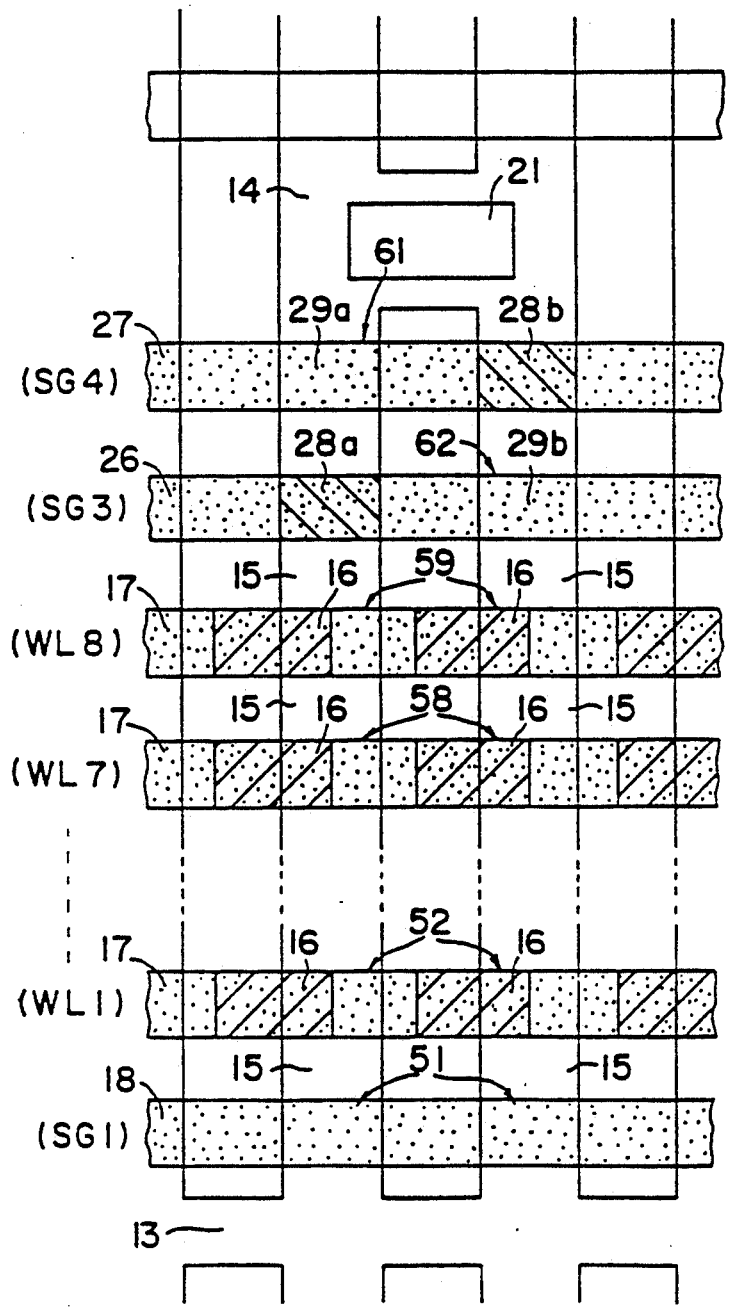
FIG. 8 is a plan view showing a second embodiment according to the present invention.

FIG. 8 is a plan view of the pattern showing the second embodiment of the memory array according to the present invention. The size, in the lateral direction in FIG. 1C, of each memory cell according to the related background art is determined by the pitch between floating gates. In the case of the embodiment memory shown in FIG. 5A, the size is determined by the pitch between drain regions 14 formed with the contact 21. The size in the lateral direction of the embodiment memory shown in FIG. 5A becomes smaller than that of the memory shown in FIG. 1C according to the related background art. However, the size of the memory shown in FIG. 5A is determined by the contact 21 so that it is not possible to make the size sufficiently small.

In view of this, the embodiment shown in FIG. 8 aims at making the size in the lateral direction smaller. Specifically, instead of the select gate 19 shown in FIG. 5A, two select gates 26 and 27 are provided as shown in FIG. 8. The right and left, two NAND basic blocks are connected in common to a single data line (not shown) via a single contact 21. In the two NAND basic blocks, the region 28a of the select gate 26 and the region 28b of the select gate 27 are formed, for example, by depletion type transistors or n+ type buried regions, and the regions 28a and 28b are made always on-state. The regions 29a and 29b are formed as enhancement type transistors.

With the above arrangement, the right and left, two NAND basic blocks can commonly use the single contact 21. As a result, the distance, in the lateral direction in FIG. 8, between basic blocks is determined by the distance between n+ diffusion layers (source or drain region 15) of a memory cell. The distance can be made smaller than that of the memory shown in FIG. 5A.

Figure 9:
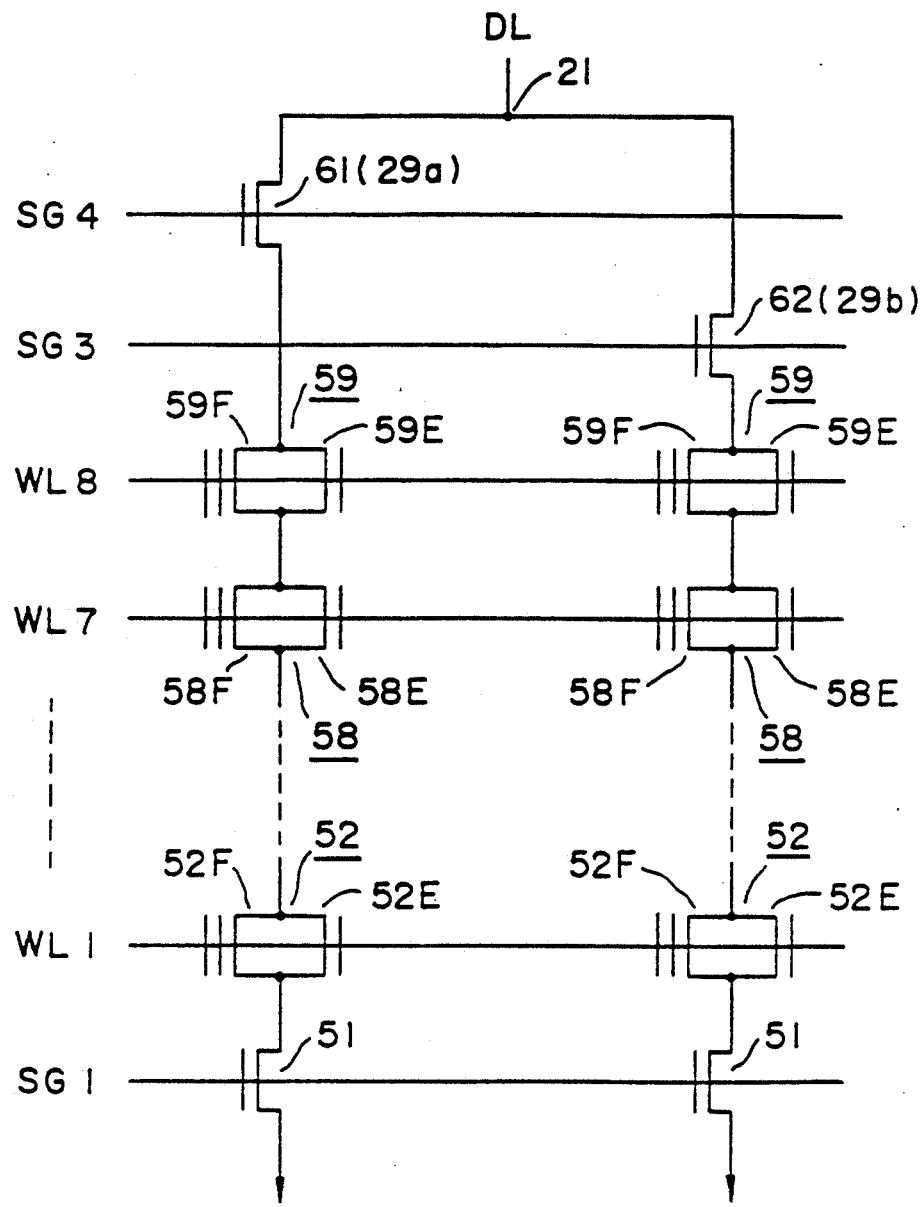
FIG. 9 is an equivalent circuit for FIG. 8.

FIG. 9 is an equivalent circuit of the two NAND basic blocks in the memory array shown in FIG. 8. In FIG. 9, reference numerals 61 and 62 represent enhancement type transistors constructed of the regions 29a and 29b of the select gates 27 and 26. The transistors 61 and 62 are controlled by select gate signals SG4 and SG3, respectively. In FIG. 9, reference numerals 52 to 59 represent memory cells, 52F to 59F floating gate transistors, and 52E to 59E enhancement type transistors.

Figure 10A:
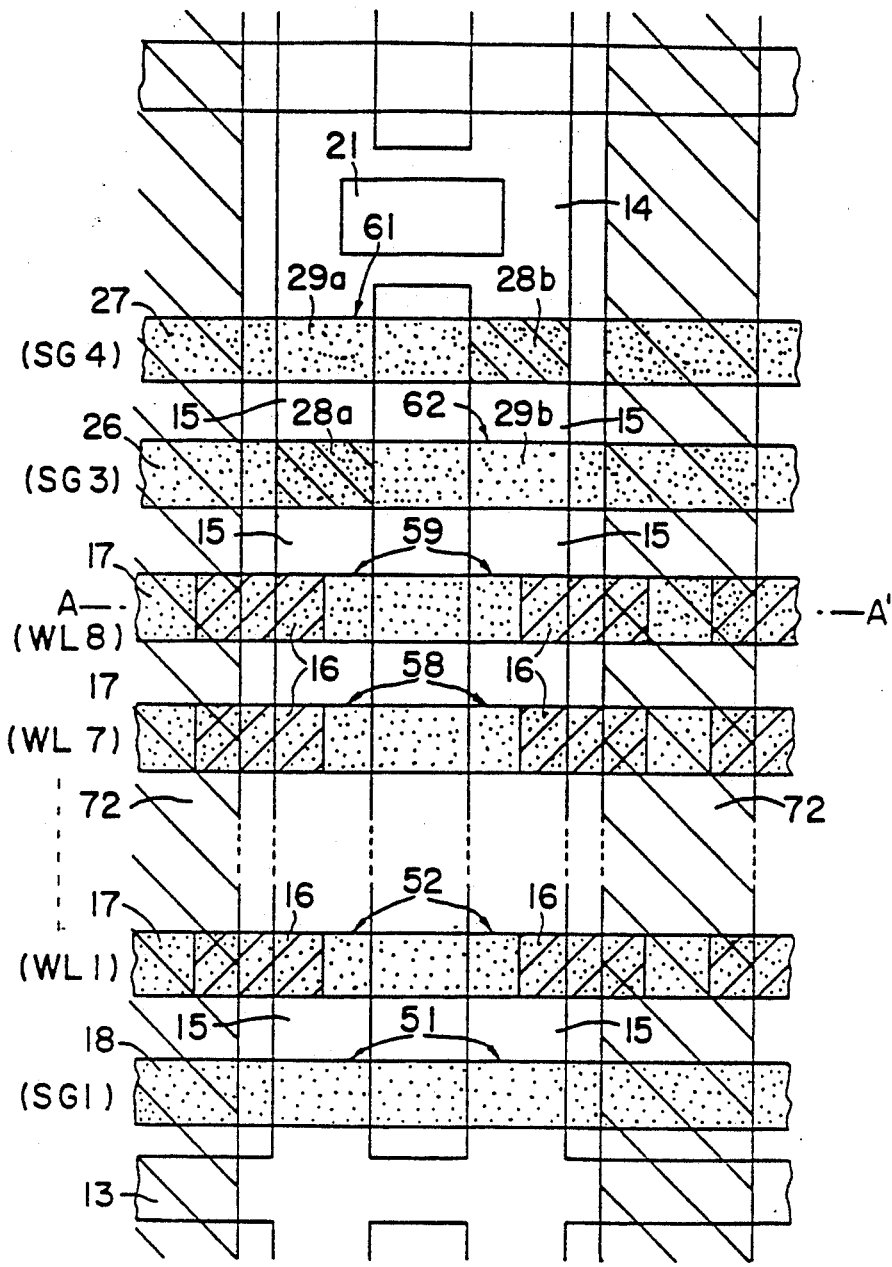
FIG. 10A is a plan view of a pattern showing a third embodiment according to the present invention.
Figure 10B:
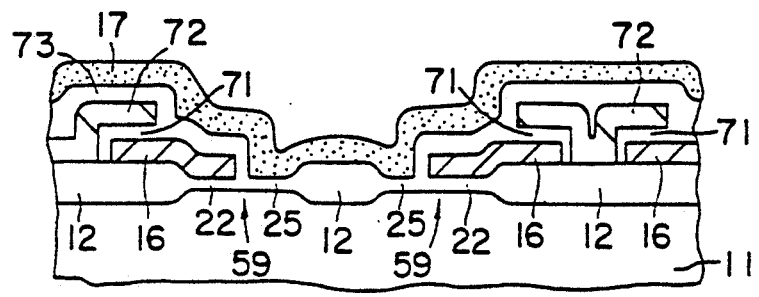
FIG. 10B is a cross section along line A—A' of FIG. 10A.

FIGS. 10A and 10B show the structure of the memory array according to the third embodiment of this invention. FIG. 10A is a plan view of the pattern, and FIG. 10B is a cross section along line A—A' of FIG. 10A. The different point of the embodiment shown in FIG. 10A from the embodiment shown in FIG. 8 is that an erase gate 72 is provided as seen particularly from FIG. 10B. Namely, as seen from FIGS. 10A and 10B, above a floating gate 16 made of a first polysilicon layer, there is formed the erase gate 72 made of a second polysilicon layer with an erase gate oxide film 71 interposed therebetween. There is further formed a control gate 17 made of a third polysilicon layer on the gate 72 with a gate insulating film 73 interposed therebetween.

Figure 11:
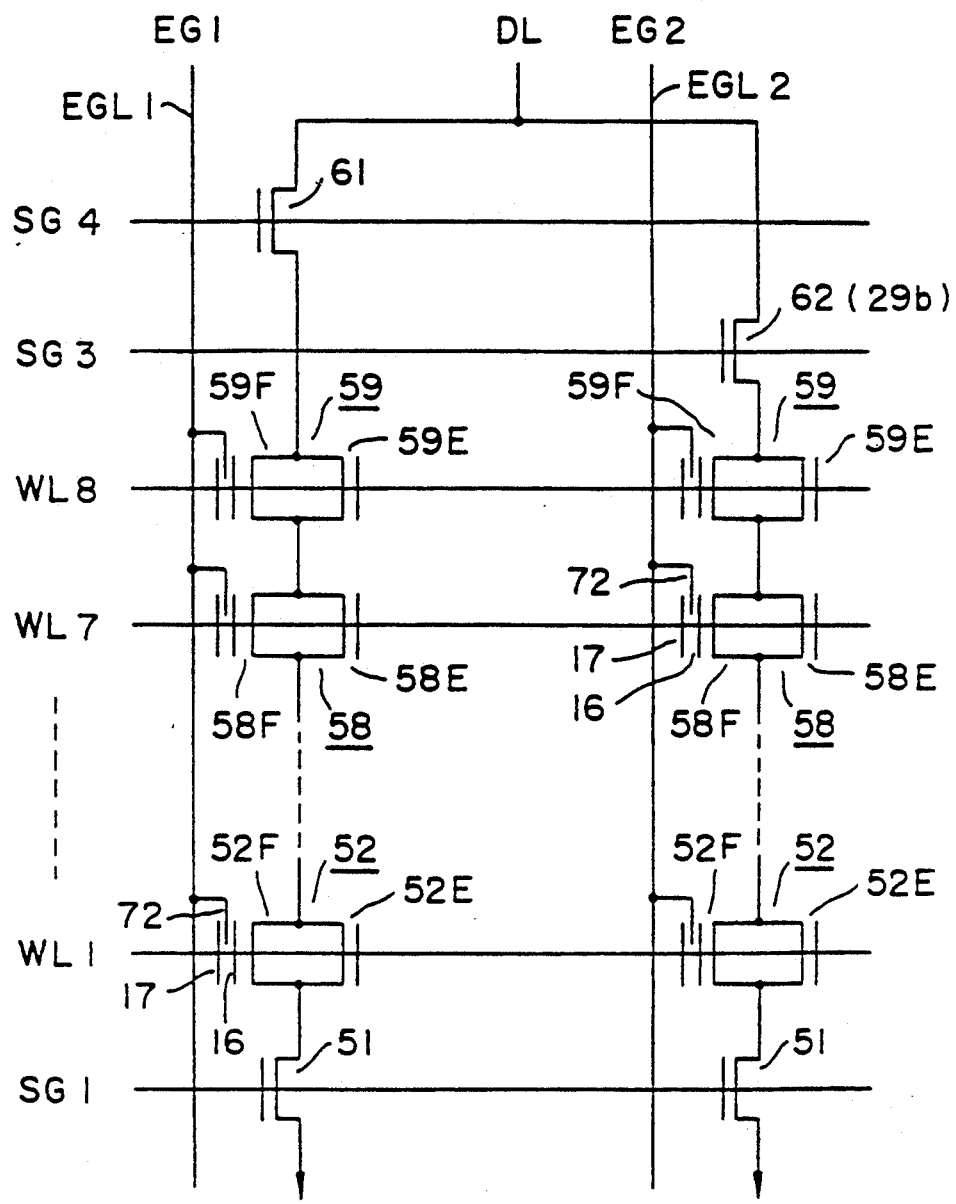
FIG. 11 is an equivalent circuit for FIG. 10A.

The equivalent circuit of two NAND basic blocks of the memory array constructed as above is shown in FIG. 11. The different point of FIG. 11 from FIG. 9 is that the erase gate 72 is positioned between the floating gate 16 and the control gate 17. These erase gates 72 are connected to erase gate lines EGL1 and EGL2 via which erase gate line signals EG1 and EG2 are applied.

In the memory constructed as above, data are erased by setting WL1 to WL8 all to 0 V, and EG1 (or EG2) to 20 V. Electrons as Fowler-Nordheim's tunnel current are therefore emitted from the floating gates 16 of the memory cells 52 to 59 connected to the gate line EGL1 (or EGL2), to the erase gate 72 to thereby erase data.

Writing data is performed in the following manner. It is assumed that a selected word line is WL1 for example. The word line WL1 is set to 12 V, data line DL to 10 V, select gate signals SG1, SG3 and SG4 to 20 V, and non-selected word lines WL2 to WL8 to 20 V. Electrons are therefore injected into the memory cell 52 by means of the hot electron effect, to thereby write data. In writing data into the memory cell 53, word line WL2 is set to 12 V while setting other word lines WL1, WL3 to WL8 to 20 V. In a similar manner, up to the memory cell 59 data can be sequentially written. The reason why the voltage of the non-selected word line is set as high as 20 V, is that each memory cell is caused to operate as a triode to suppress the generation of hot electrons and hence prevent writing erroneous data.

In the embodiment shown in FIG. 10A, electron emission from the floating gate 16 is carried out not to the substrate but to the erase gate 72. As a result, it is possible to make the gate oxide film 22 formed between the floating gate 16 and the substrate 11 thick, e.g., in the order of 300 Å. The reliability of the gate oxide film 22 is thereby improved to the degree that high reliability similar to an ultraviolet ray erasure type EPROM can be obtained.

Figure 13A:
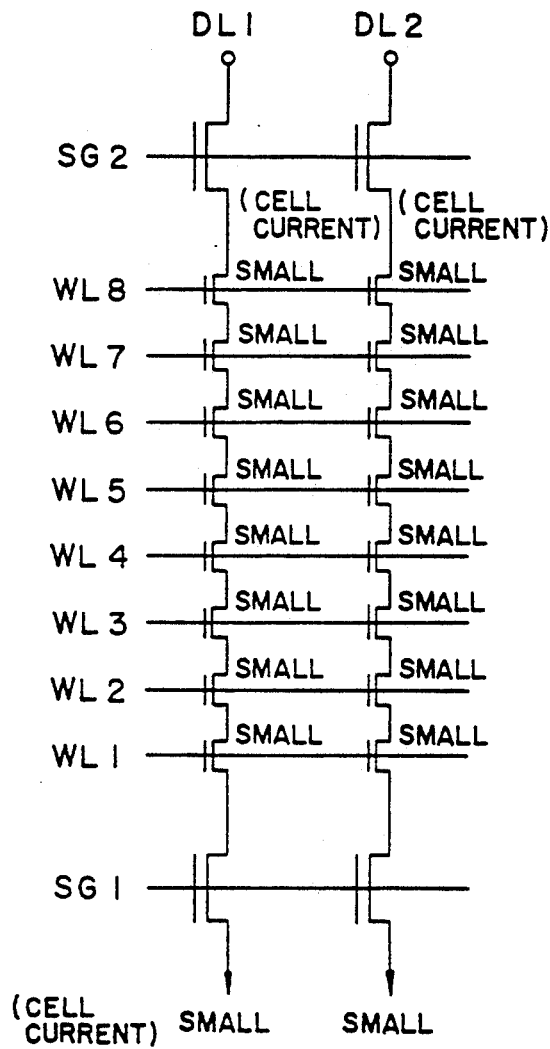
FIG. 13A is a diagram illustrating a cell current for FIG. 5A.

FIG. 12 is a plan view of the pattern according to the fourth embodiment of this invention. In FIG. 12, similar constitutional elements to those shown in FIG. 5A are represented by identical reference numerals. The different point of the embodiment shown in FIG. 12 from that shown in FIG. 5A is that each floating gate 16 is displaced right or left (in the extension direction of control gate 17) to be disposed in a so-called staggered arrangement. Namely, the positions of the floating gates 16 are alternately displaced for each word line and for each data line. With this arrangement, a large margin of displacement in mask alignment during manufacturing processes can be obtained. This will be explained while comparing with the case where the positions of the floating gates 16 are not displaced right or left as shown in FIG. 5A. In FIG. 5A, all the floating gates 16 are displaced left as viewed in FIG. 5A from the state shown in FIG. 1A. Cells shown in FIG. 5A have a smaller margin of displacement in mask alignment during manufacturing processes. For example, it is assumed that the floating gates 16 shown in FIG. 5A are displaced right because of mask displacement at the time of forming the floating gates 16 during the manufacturing processes. In reading data from a cell of the NAND structure, a selected word line is set to 0 V, and the other word lines are set, e.g., to 5 V, as seen from Table 1. In such a case, if "0" has been written in the memory cell connected to the selected word line, this memory cell becomes the on-state due to the threshold voltage of −5 V so that current flows through the cell group of the NAND structure. If "1" has been written in the selected memory cell, this memory cell becomes the off-state due to its threshold voltage of 5 V so that current will not flow. That the on-current becomes minimum, i.e., the speed becomes worst, is caused when only the selected cell has the data "0" and the other seven cells have data "1". Specifically, in the equivalent circuit shown in FIG. 6, assuming that WL1 is being selected, the on-current is determined by the characteristics of the enhancement type transistors $33b$ to $39b$. This is because the transistor $32a$ in the on-state has a threshold voltage sufficiently negative so that it allows a sufficient current to flow as compared to the transistors $33b$ to $39b$. Accordingly, assuming that the floating gates 16 displace to the right due to mask displacement, the enhancement type transistors $32b$ to $39b$ all allow a small current to flow as shown in FIG. 13A. If a memory is formed in such a manufacturing condition, the speed is lowered and in some cases the manufactured memory becomes a faulty one.

Figure 13B:
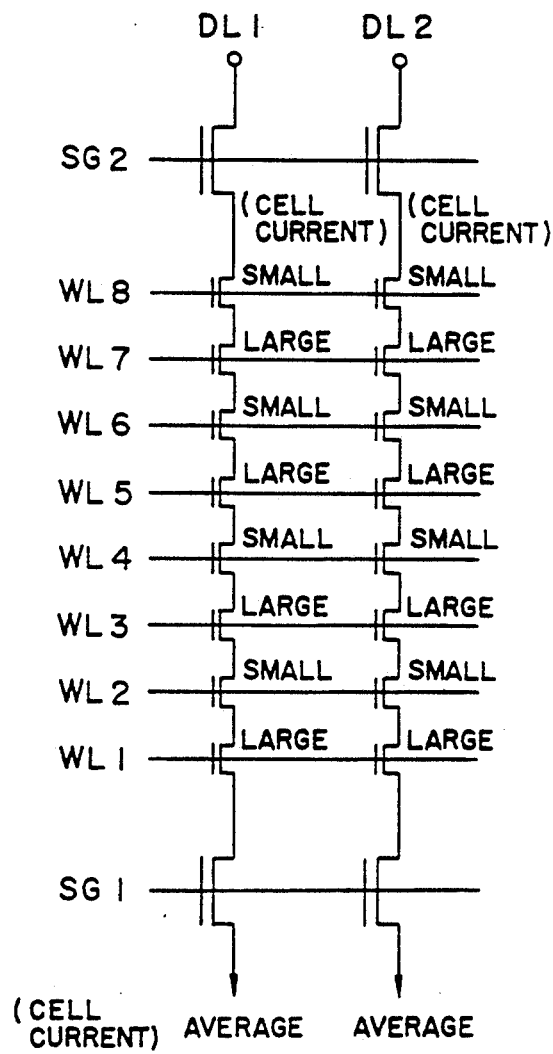
FIG. 13B is a diagram illustrating a cell current for FIG. 12.

In contrast, according to the embodiment shown in FIG. 12, there is a large margin of such mask displacement. Specifically, assuming that the floating gates of the cells shown in FIG. 12 are displaced right as above, the equivalent circuit thereof is as shown in FIG. 13B. For a certain data line, the current values of the enhancement type transistors become small and large alternately for each word line, so that four cells of the eight NAND cells have a large current and the remaining four cells have a small current. The total current becomes an average current thereof. In other words, even with mask displacement, the current value does not become too small.

Figure 14:
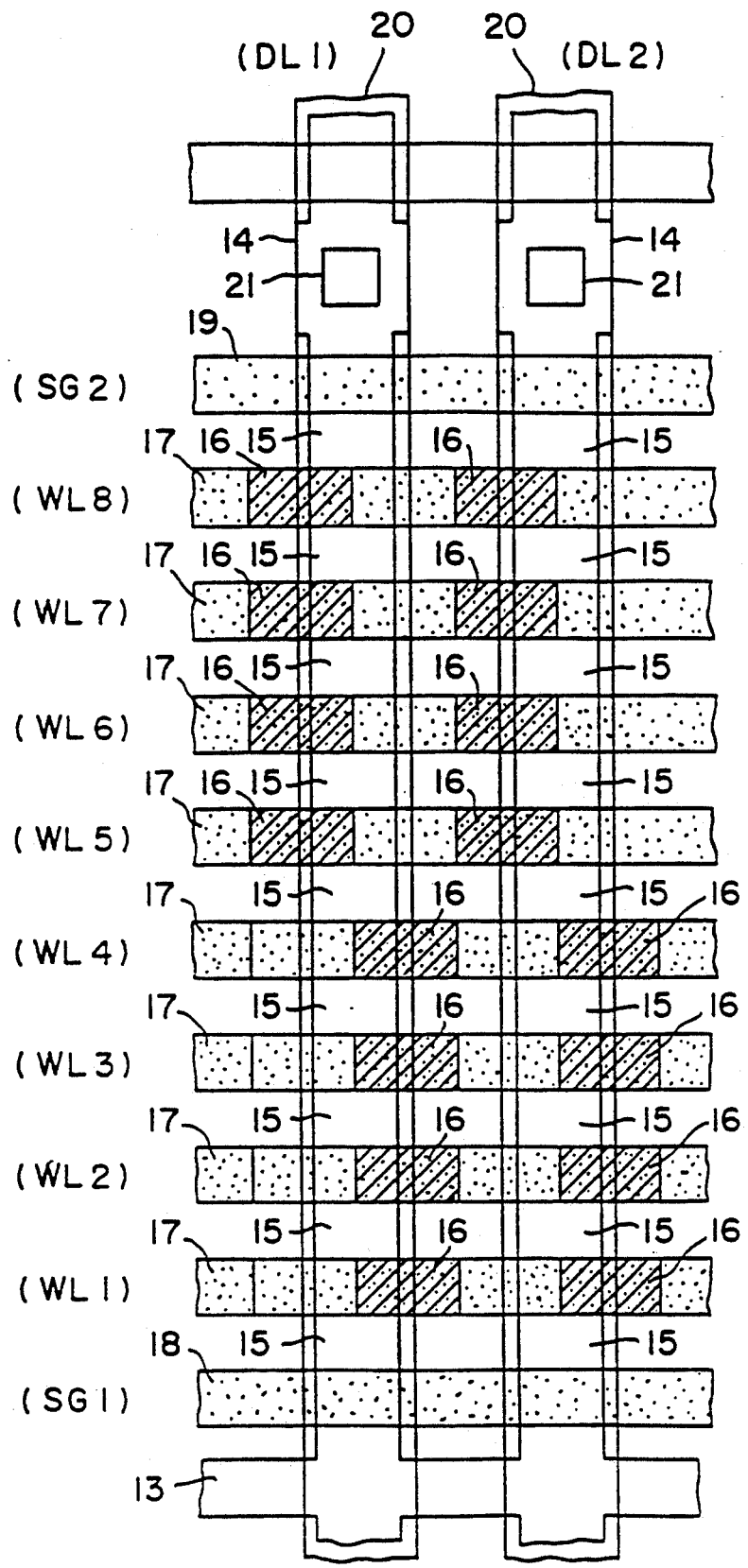
FIG. 14 shows the fourth embodiment modified from the fourth embodiment.

In the fourth embodiment, the floating gates are displaced alternately for each word line. It is not necessary to use such an arrangement by all means. For example, as seen from the fifth embodiment shown in FIG. 14, the displacement direction of the floating gate may be changed collectively for word lines WL1 to WL4 and word lines WL5 to WL8. By collectively displacing as above, the manufacturing technique becomes simple. It is also unnecessary that the same number of floating gates be displaced for each direction.

Figure 15A:
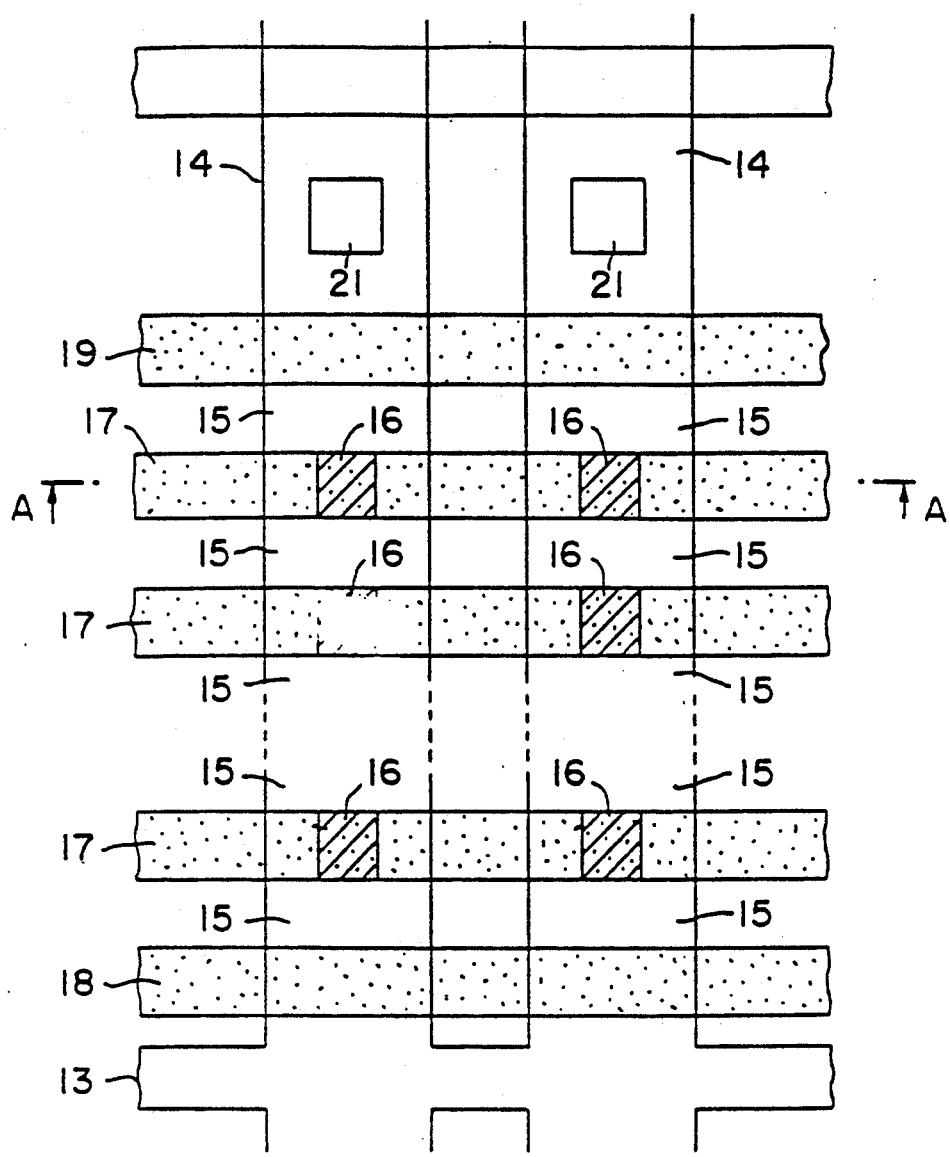
FIG. 15A is a plan view of a pattern showing a sixth embodiment according to the present invention.
Figure 15B:
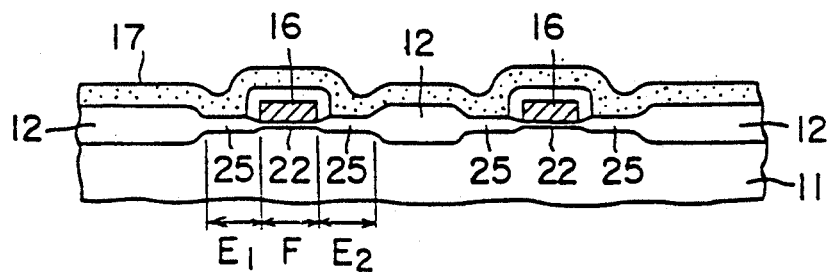
FIG. 15B is a cross section along line A—A' of FIG. 15A.

FIGS. 15A and 15B show the sixth embodiment of this invention. FIG. 15A is a plan view of the pattern, and FIG. 15B is a cross section along line A—A' of FIG. 15A. The different point of the memory of this embodiment from that shown in FIGS. 5A and 5B is that each floating gate 16 is positioned generally at the center of the channel region of each memory cell in the widthwise direction. In the memory of this embodiment, the channel width of the floating gate transistor of each memory cell is determined by a length F indicated in FIG. 15B, and the channel width of the enhancement-type transistor is determined by a length (E1+E2). Even if the floating gates 16 are displaced in the right-/left direction as viewed in FIG. 15B due to an occurrence of mask displacement in the right/left direction at the time of forming the floating gates 16, the length F and length (E1+E2) are maintained constant.

It is unnecessary to have a uniform a thickness of the gate oxide film 22 between the semiconductor substrate 11 and the floating gate 16. As shown in FIG. 16B (seventh embodiment) and FIG. 17B (eighth embodiment), the upper position of the channel may be made thicker (t2), and only the tunnel portions 42 and 43 for passing tunnel current may be made partially thinner (t1, where t1<t2).

Figure 16A:
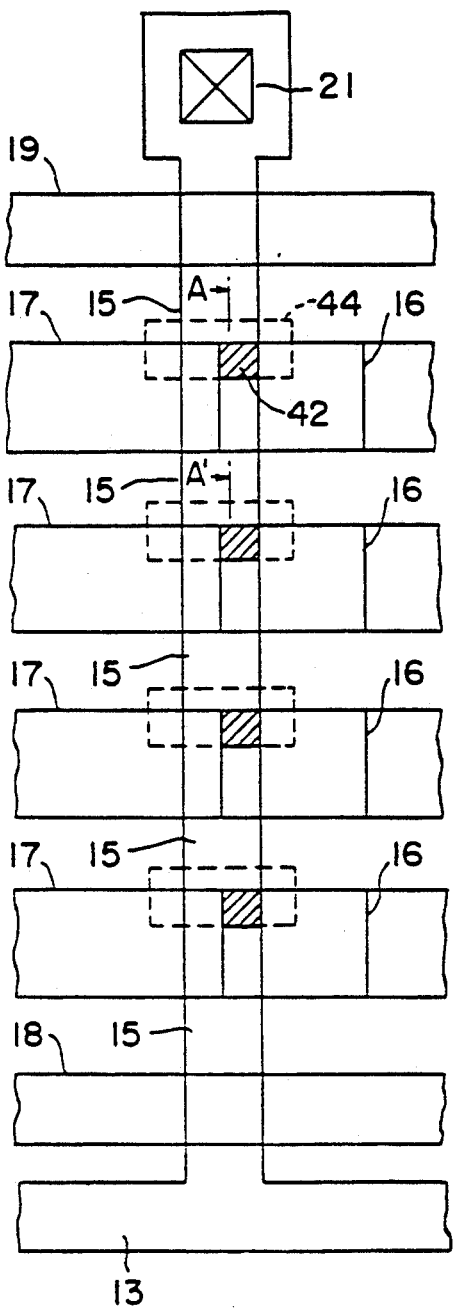
FIG. 16A is a plan view of a pattern showing a seventh embodiment according to the present invention.
Figure 16B:
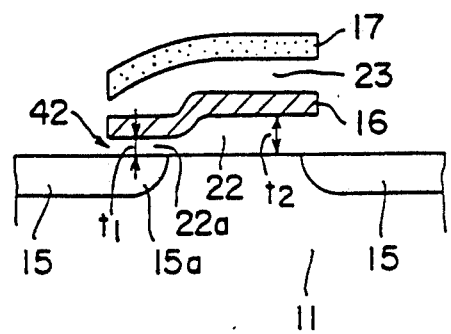
FIGS. 16B and 17B are cross sections along line A—A' respectively of FIGS. 16A and 17B.
Figure 17A:
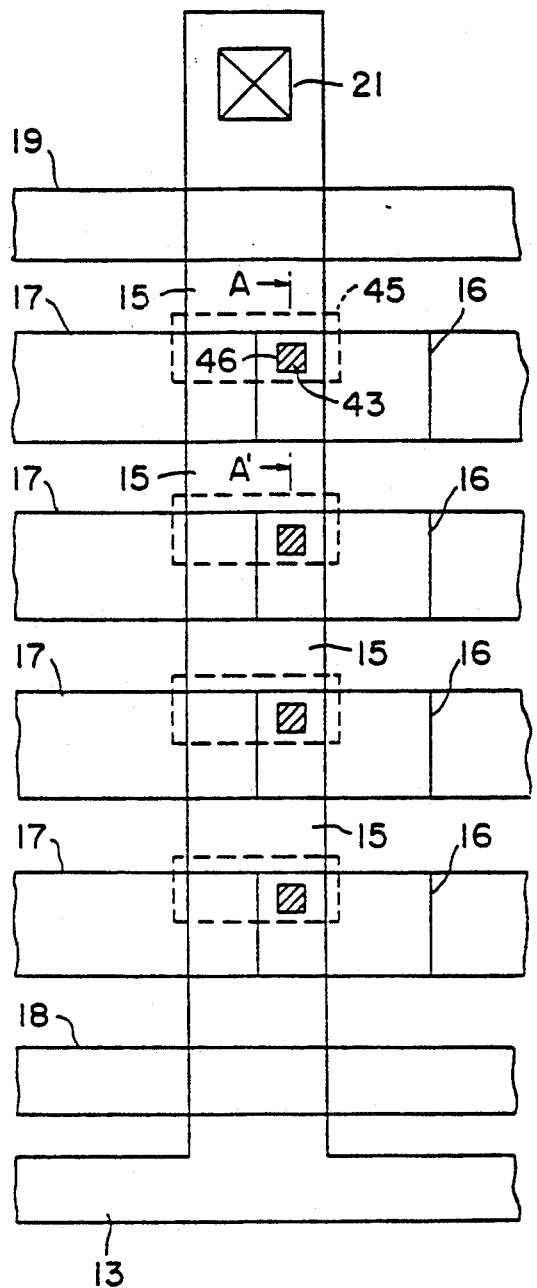
FIG. 17A is a plan view of a pattern showing an eighth embodiment according to the present invention.
Figure 17B:
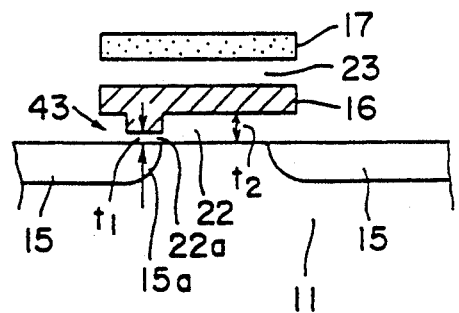

More specifically, as understood from FIG. 16B which is a cross section along line A—A' of FIG. 16A, and from FIG. 17B which is a cross section along line A—A' of FIG. 17A, the tunnel portions 42 and 43 are formed at the upper left corners of the floating gates 16 displaced right as viewed in the figures.

More specifically, the tunnel portion 42 shown in FIGS. 16A and 16B is formed in the following manner. Namely, the oxide film 22 on the substrate 11 is first removed using an opening 44 as a mask. Next, using the opening as a mask, ions such as N+ are injected so that a diffusion region 15a is formed on the substrate 11 under the opening 44. This region 15a is integrally connected to the source/drain region 15 to be formed thereafter. Then, an oxide film 22a is thinly formed (t1) on the substrate 11. This oxide film 22a becomes in unison with the originally formed oxide film. Thereafter, there are formed on the oxide films 22 and 22a, the floating gate 16, oxide film 23, and control gate 17.

The tunnel portion 43 shown in FIGS. 17A and 17B is formed in substantially the same manner as in FIGS. 16A and 16B. In this case, in forming the tunnel portion 43, ion injection is performed through an opening 45, and the oxide film 22a is formed through an opening 46.

Figure 18:
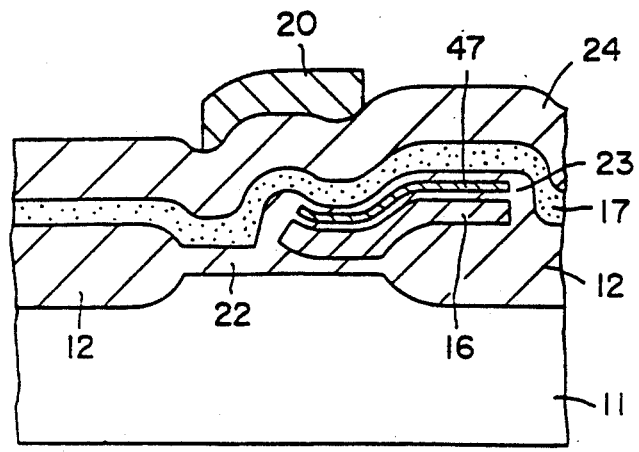
FIGS. 18 and 19 are cross sections showing a ninth embodiment.
Figure 19:
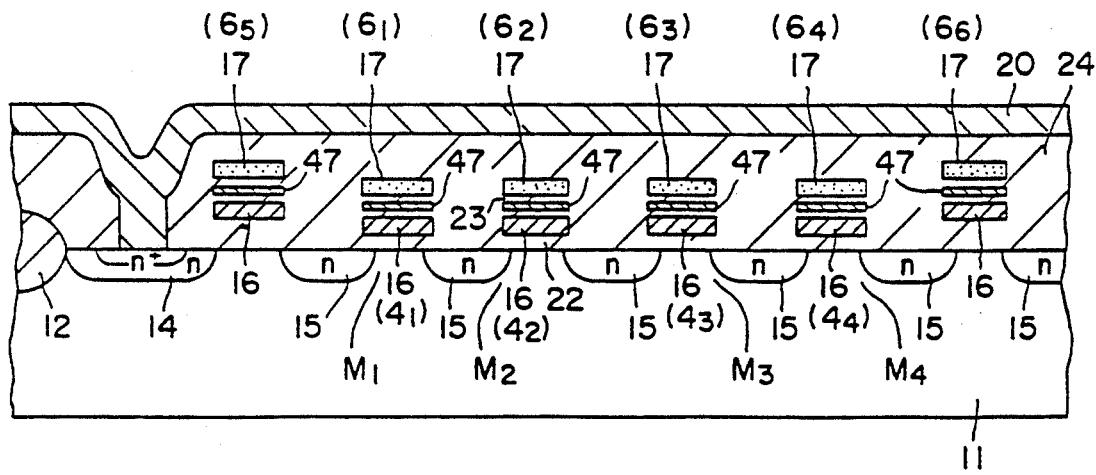

FIGS. 18 and 19 are cross sections of the ninth embodiment. FIG. 18 corresponds to FIG. 5B. FIG. 19 corresponds to a cross section along line B—B' of FIG. 5A. The eighth embodiment shows the case where a silicon nitride film 47 is formed between the floating gate 16 and the control gate 17 of the first embodiment shown in FIGS. 5A and 5B.

The method of manufacturing a memory having the cross sections shown in FIGS. 18 and 19, will be described with reference to FIGS. 20A to 20D and FIGS. 21A to 21D. FIGS. 20A to 20D correspond to FIG. 18, and FIGS. 21A to 21D correspond to FIG. 19.

Figure 21A:
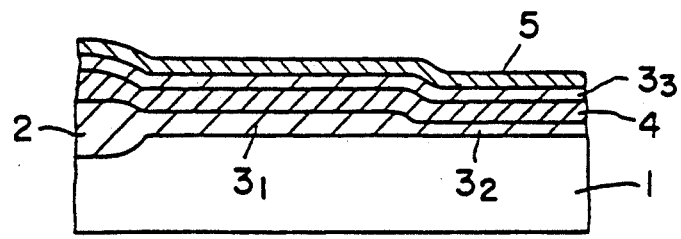

First, as seen from FIGS. 20A and 21A, after forming an element separation insulating film 2 on a p-type Si substrate 1, there is formed a first gate insulating film $3_1$ made of 300 to 400 Å thermal oxide film (FIG. 21A). The portion of the first gate insulating film $3_1$ corresponding to the channel region of a memory cell, is removed with hydrofluoric acid solution or by means of a reactive ion etching, and thereafter there is formed at this portion a second gate insulating film $3_2$ made of 50 to 200 Å thermal oxide film. Next, a first polycrystalline silicon film 4 of 500 to 4000 Å for forming the floating gate is deposited over the whole surface. On this first polycrystalline silicon film 4, there is formed a third gate insulating film $3_3$ of 80 to 200 Å made of a thermal oxide film, and thereafter a silicon nitride film 5 of 80 to 200 Å is deposited by means of CVD.

Figure 21B:
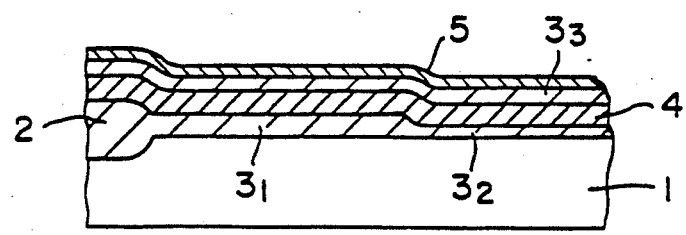

Next, as seen from FIGS. 20B and 21B, the nitride film 5, third gate insulating film $3_3$, and first polycrystalline silicon film 4 are selectively etched by means of reactive ion etching, to thereby form a slit separating floating gates between adjoining NAND cells. This slit is patterned so that it partially overlaps the element region and partially exposes an area above the channel region. At this stage, the first polycrystalline silicon film 4 is not yet separated between memory cells $M_1$ to $M_4$.

Figure 21C:
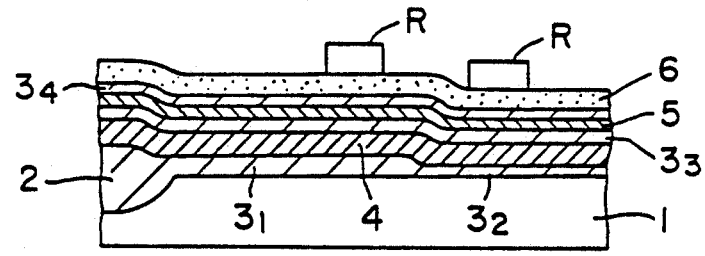
Figure 21C:
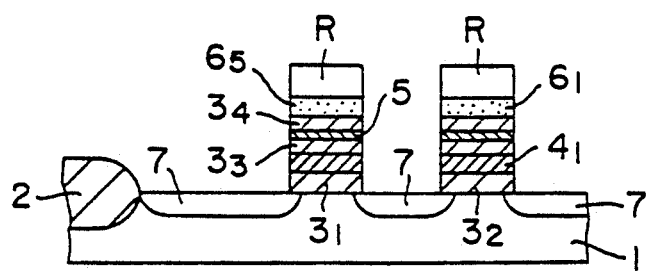

Thereafter, there is formed above the channel region a fourth gate insulating film $3_4$ of 300 to 400 Å by means of thermal oxidation (FIGS. 20C and 21C). At this time, the surface of the nitride film 5 above the first polycrystalline silicon film 4 is oxidized, to thereby form a high voltage withstand interlayer insulating film of a three-layered structure made of oxide film, nitride film and oxide film. Since the oxidation speed on the nitride film 5 is slow, the thickness of the insulating film on the first polycrystalline silicon film 4 will not become unnecessarily thick. This is significant in that the capacitance ratio between gates are set at optimum values and the write characteristics is not deteriorated.

Next, there is deposited a second polycrystalline silicon film 6 of 1000 to 4000 Å for forming control gates (FIGS. 20C and 21C1). Next, cell control gates $6_1$ to $6_4$ and cell select gates $6_5$ and $6_6$ are formed by means of reactive ion etching (patterning) while using as a mask a resist R pattern. At this time, by using the same mask, patterning is carried out to the depth of the first polycrystalline silicon film 4 to thereby form floating gates $4_1$ to $4_4$ separately.

Figure 2:
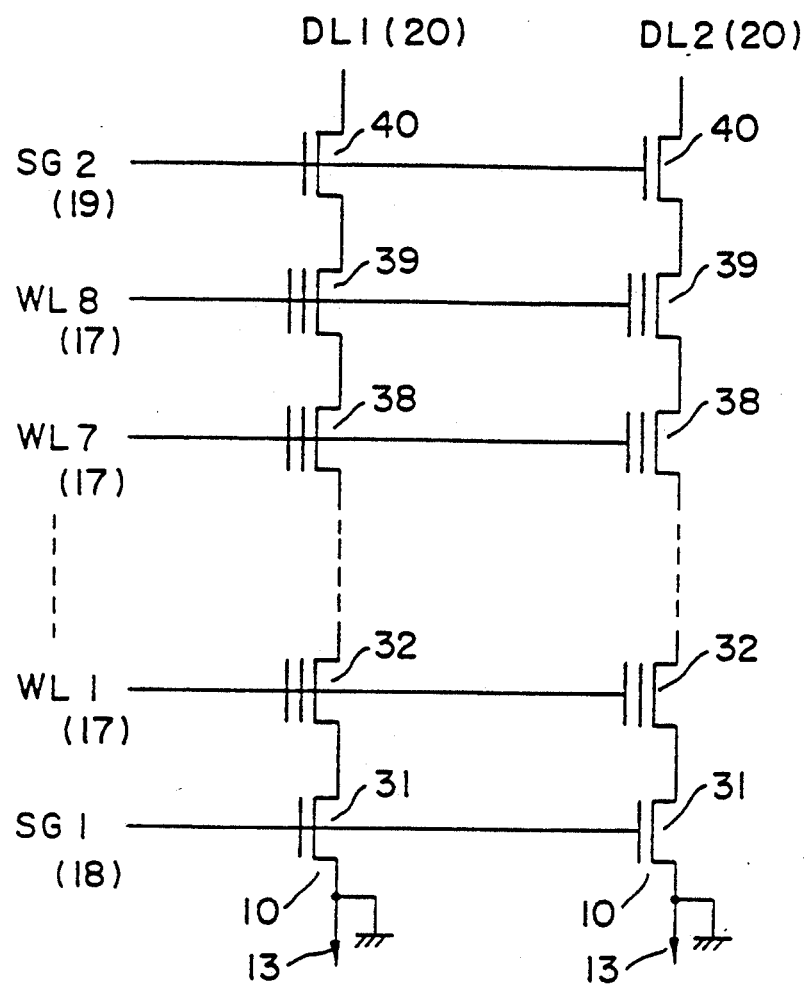
FIG. 2 is an equivalent circuit for FIG. 1A.
Figure 3A:
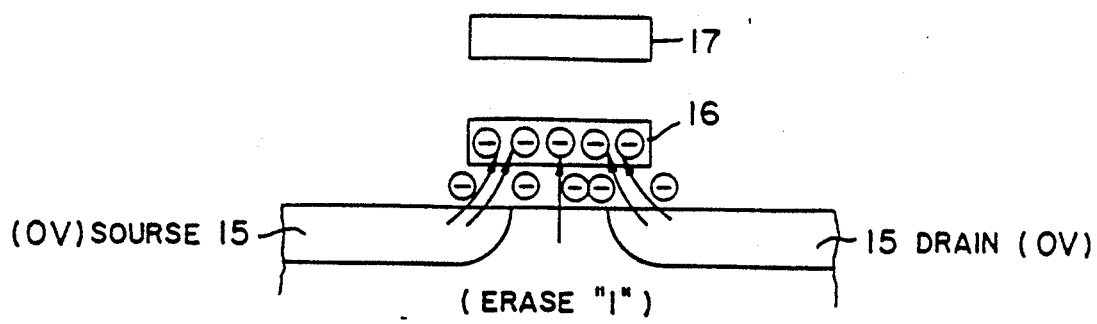
FIGS. 3A and 3B are views illustrating the erase/write operation of a floating gate transistor.
Figure 3B:
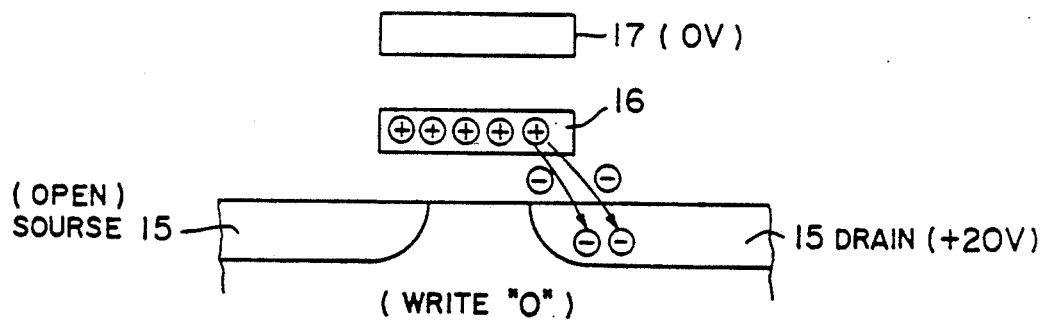
Figure 4:
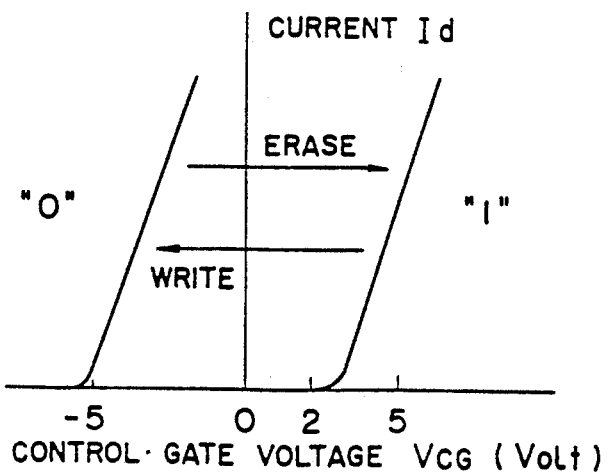
FIG. 4 shows the characteristic curves of the threshold voltage of a floating gate transistor in an erase state and in a write state.

Thereafter, by using these gate electrodes as a mask, ions are injected to form an n-type layer 7 which is a source/drain diffusion layer (FIG. 21C2).

Figure 21D:
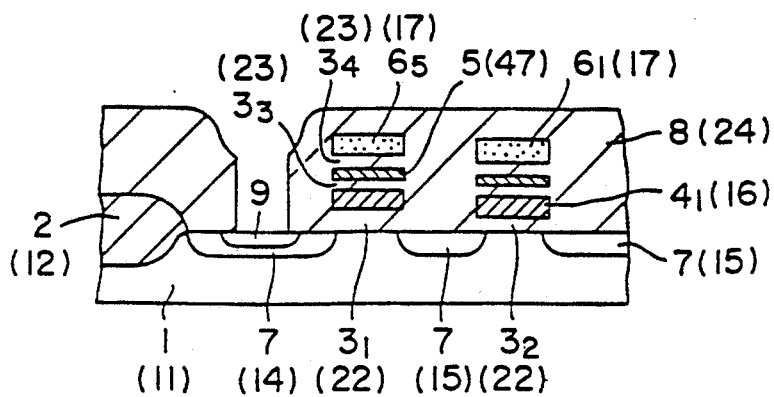

Next, the whole surface is covered with a CVD insulating film 8 to then open contact holes in the drain regions. Ions are again injected through the contact holes to form an n+ type layer 9 (FIGS. 20D and 21D). Lastly, wirings such as bit lines are formed by means of Al vapor deposition and patterning, to thereby obtain a finished memory.

Figure 22:
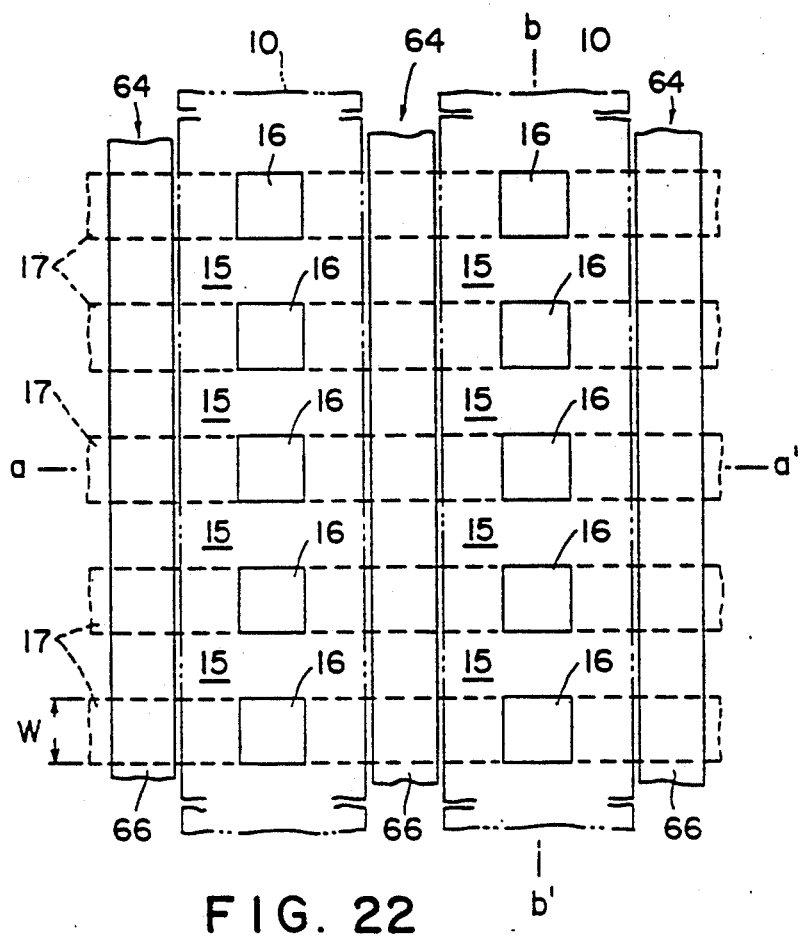
FIG. 22 is a plan view of a pattern showing a tenth embodiment.
Figure 24:
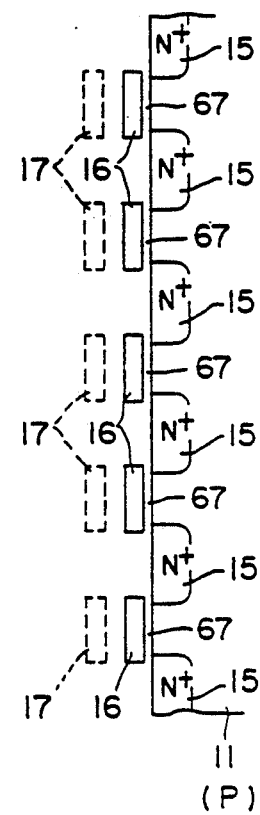
FIG. 24 is a cross section along line b—b' of FIG. 22.
Figure 23:
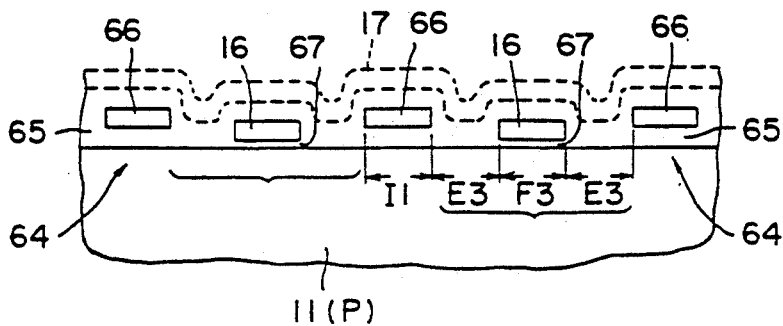
FIG. 23 is a cross section along line a—a' of FIG. 22.

FIG. 22 shows the tenth embodiment of this invention. FIG. 22 shows, in contrast with FIG. 15A, only the cell portion of the right and left, two NAND basic blocks 10. The cross section along line a—a' of FIG. 22 is shown in FIG. 23, and the cross section along line b—b' is shown in FIG. 24. As seen from FIG. 24, the structure shown in the cross section along line b—b' is the same as FIG. 15A. The structure shown in the cross section along line a—a', however, is different from FIG. 15A as seen from FIG. 23. Namely, the NAND basic blocks 10 and 10 are separated not by the field oxide film but by an enhancement type MOS transistor (separation transistor) 64 extending in the up/down direction as viewed in FIG. 22. That is, a field oxide film is not necessary. This separation transistor 64 is constructed by forming a gate electrode 66 on the semiconductor substrate (p type) 11 with a gate oxide film 65 interposed therebetween. The gate electrode 66 is set to the potential same as the substrate 11 in an ordinary use state to separate the blocks 10 and 10. The floating gate 16 is formed, similar to the case shown in FIG. 15A, at the position covering only the central portion of the channel (E3+F3+E3) with a thin gate oxide film interposed therebetween. Namely, the portion having the width F3 of the whole channel width (E3+F3+E3) is covered with the floating gate 16, to thus form a floating gate transistor having a channel width F3. The floating gate 16 and the gate electrode are formed at the same time using the same mask. Therefore, the relative distance between the floating gate 16 and the gate electrode 66 is constant. In other words, there occurs no mask displacement between the gates 16 and 66. It is not necessary, accordingly, to prepare some margin in the right/left direction as viewed in FIGS. 22 and 23. In addition, it is not necessary to form a field oxide film as described above, to therefore make the overall size of the memory small.

Next, the method of manufacturing the memory shown in FIGS. 22 to 24 will be described with reference to FIGS. 25A to 25G.

Figure 25A:
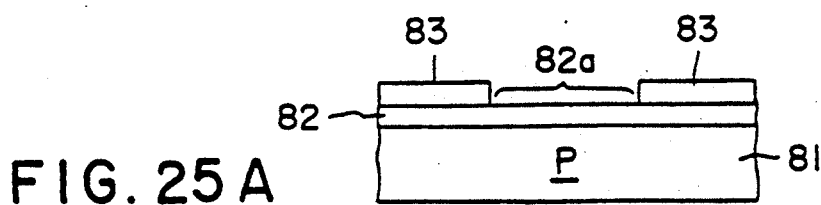
FIGS. 25A to 25G are cross sections showing manufacturing steps of a first manufacturing method of the tenth embodiment.

Referring to FIG. 25A, a gate insulating film 82 for the separation transistor is grown on a semiconductor substrate 81 by thermal oxidation. Next, a resist 83 is deposited on the film 82 in order to form a thin oxide film 67 under the floating gate.

Figure 25B:
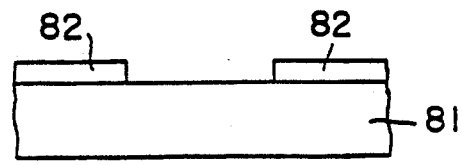

Next, the insulating film 82a above the region where the floating gate transistor is to be formed, is removed by using the resist 83 as a mask. This is shown in FIG. 25B.

Figure 25C:
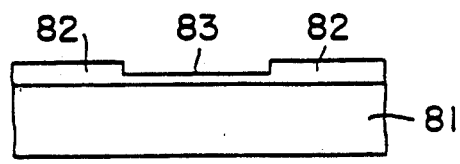
Figure 25D:
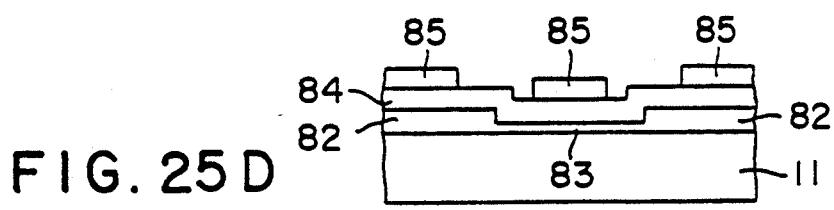

Next, there is formed an oxide film 83 about 100 Å serving as the floating gate oxide film (FIG. 25C).

Next, a polysilicon 84 is deposited in order to form the separation transistor gate and the floating gate. A resist 85 is applied on the polysilicon 84, the resist being patterned in the form of the separation transistor gate and the floating gate.

Figure 25E:
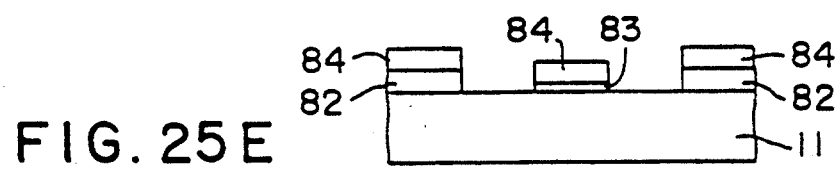

The polysilicon 84 and the insulating film 82 are etched using the resist 85 as a mask. After etching, the resist is removed (FIG. 25E).

Figure 25F:
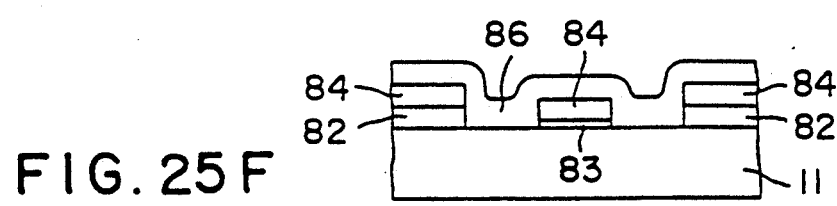

Thereafter, an oxide film 86 is formed through oxidation (FIG. 25F).

Figure 25G:
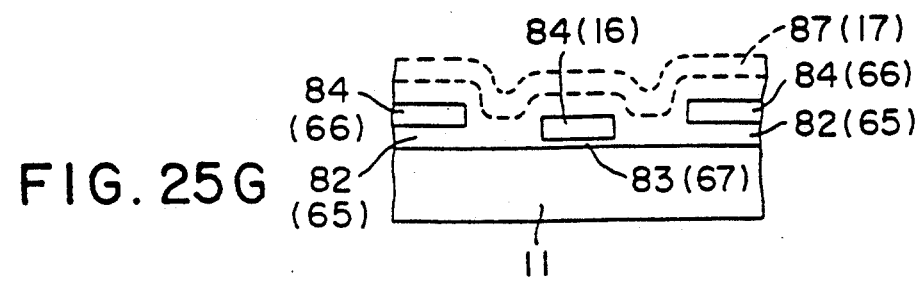

Next, there is deposited on the film 86 a polysilicon serving as the control gate (FIG. 25G). The polysilicon 87 is subjected to PEP (Photo Etching Process) to form a predetermined pattern by using a resist (FIG. 25G). Thereafter, N+ regions serving as the memory cell sources/drains are formed through ion implantation or the like by using as a mask the control gate and the separation transistor.

With the above method, the distance between the floating gate and the separation transistor gate 66 shown in FIG. 22 can be determined without any error. In other words, self alignment can be achieved in the right-/left direction as viewed in FIG. 22.

The method of manufacturing the memory shown in FIGS. 22 to 24 without displacement not only in the right/left direction but also in the up/down direction respectively as viewed in FIG. 22, will be described with reference to FIGS. 26A to 31C.

FIGS. 26A and 26B according to this method correspond to FIG. 25 of the above-described method. The cross section along line a—a' of FIG. 26A is shown in FIG. 26B. This method is the same as the above-described method with respect to FIGS. 26A and 26B.

Next, as seen from FIG. 27A and FIG. 27B showing the cross section along a—a' of FIG. 27A, a polysilicon 84 is deposited on the films 82 and 83 shown in FIG. 26A and 26B. A resist 85 is applied on the polysilicon 84. The resist 85 is patterned in a stripe shape to form resists 85a and 85b. As seen from FIGS. 27A and 23, the resist 85a is arranged to have the width F3 of the floating gate 16, and the resist 85b is arranged to have the width I1 of the separation transistor gate 66.

Next, as seen from FIG. 28A and FIG. 28B showing the cross section along line a—a' of FIG. 28A, the polysilicon 84 and the films 82 and 83 are etched using the resists 85a and 85b as a mask. Thereafter, the polysilicon 84 and the substrate 11 are oxidized to form an oxide film 86. There is formed on this film 86 a polysilicon 87 in order to form the control gate.

Figure 29A:
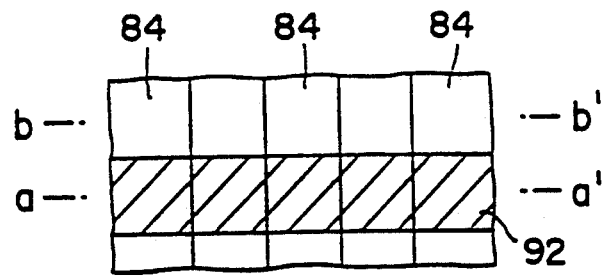
Figure 29B:
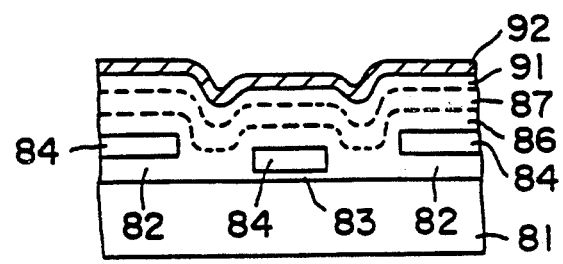
Figure 29C:
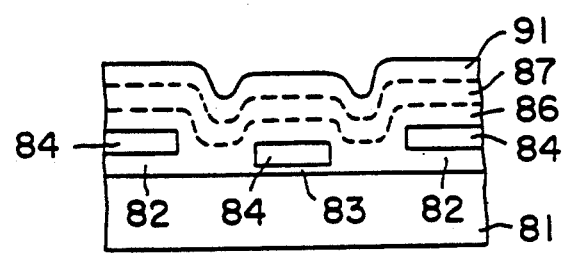

Next, as seen from FIG. 29A and its cross section along a—a' (FIG. 29B) and its cross section along line b—b' (FIG. 29C), the polysilicon 87 is oxidized to form an oxide film 91. A resist 92 is applied on the film 91. As particularly shown in FIG. 29A, the resist 92 is arranged to have a width W at the region where the control gate 16 (refer to FIG. 22) is to be formed.

Next, oxide film 91, polysilicon 87 and oxide film 86 are etched using the resist 92 as a mask.

Figure 30A:
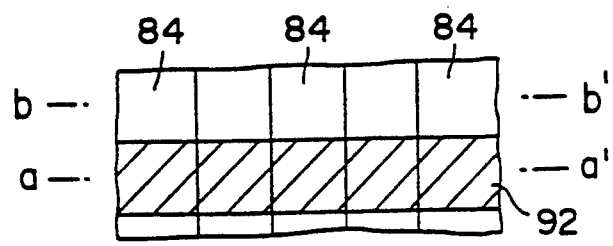
Figure 30B:
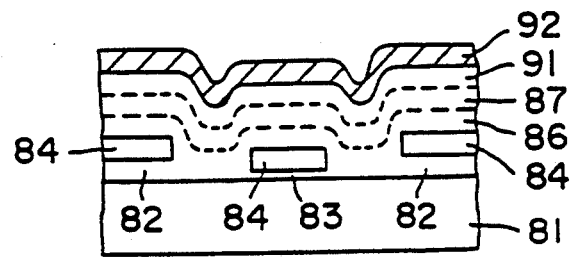
Figure 30C:
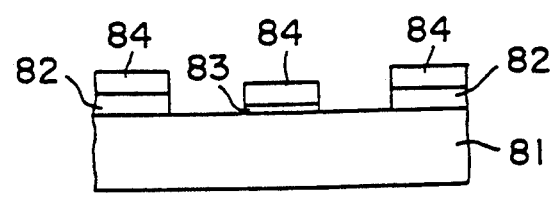

The condition after this etching is shown in the cross section (FIG. 30B) along line a—a' of FIG. 30A and in the cross section (FIG. 30C) along line b—b' of FIG. 30A. FIG. 30B corresponds to FIG. 29B, and FIG. 30C corresponds to FIG. 29C. As seen from FIGS. 30B and 29B, the portion under the resist 92 is not etched. However, as seen from FIGS. 30C and 29C, the portion not covered with the resist 92 is etched to thereby expose the substrate 81 and the polysilicon 84.

Figure 31A:
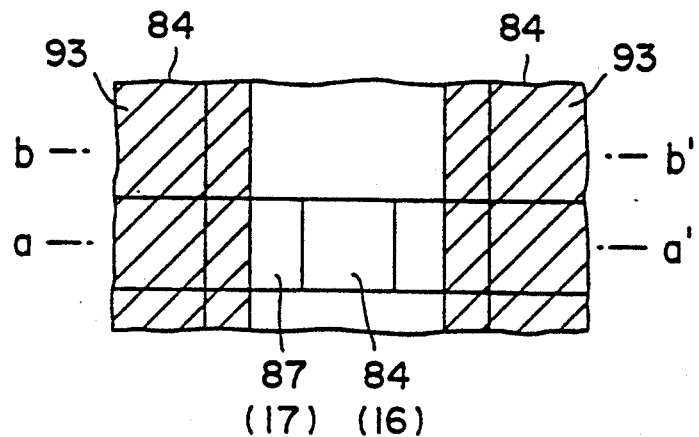
Figure 31B:
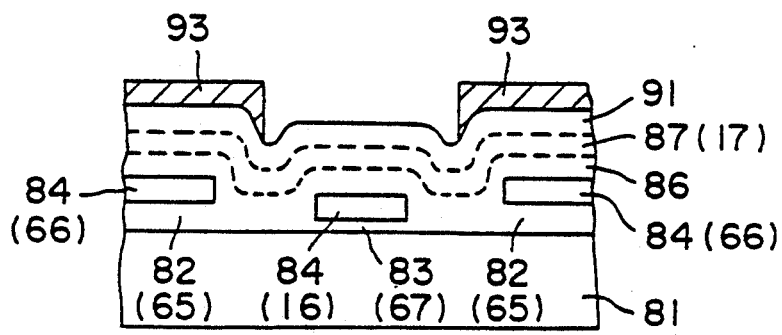
Figure 31C:
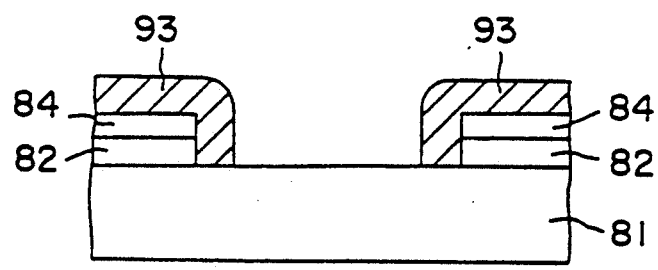

Next, as seen from FIGS. 31A and its cross section along line a—a' (FIG. 31B) and its cross section along line b—b' (FIG. 31C), the resist 92 is removed. Next, another resist 93 is applied on the surface and patterned to leave the resist 93 only above the region where the separation transistor is to be formed. Next, etching is performed using the resist 93 and oxide film 91 as a mask. As a result, the polysilicon 84 shown at the center of FIG. 30A is removed at the portion extending outside of the oxide film 91, and remained as the floating gate 16 at the portion under the oxide film 91.

Next, the resist 93 is removed, and N+ regions (refer to FIG. 24) serving as the memory cell source/drain regions 15 are formed through ion implantation or the like by using as a mask the control gate 87 (17) and separation transistor gate 84 (66). The succeeding processes are similar to the conventional processes.

As described above, according to the manufacturing method illustrated in FIGS. 26A to 31C, it is possible to form the floating gate 16 and enhancement type transistor of a memory cell by means of self alignment, thereby preventing the variation of characteristics caused by mask displacement. In addition, since the separation transistor 64 is used, it is not necessary to use a field oxide film. As a result, a memory cell can be formed at the pitch of polysilicon, to thereby make the cell size smaller when compared with the method which uses a field region for separation.

In the above embodiments, the operation has been described with the definition that electrons are injected into the floating gate for the erase operation, and electrons withdrawn therefrom for the write operation. However, the operation may be described with the opposite definition that electrons are injected into the floating gate for the write operation, and electrons are withdrawn therefrom for the erase operation. Furthermore, although all memory cells are collectively erased in the above embodiments, they may be erased for each word line by selectively applying a voltage to a word line during the erase operation. The invention is not limited to the above embodiments, but various modifications may be possible which do not contradict the gist of this invention. For example, although the memory size becomes large to some degree, an independent E type transistor is provided in parallel with a conventional floating gate transistor, with the arrangement that the control gate is used commonly and the channel portion is separately formed. Furthermore, although a floating type non-volatile memory has been described, the gist of the present invention is not limited thereto, but a memory cell of a so-called MNOS (Metal-Nitride-Oxide-Semiconductor) type where electric charges are charged at the trap level is also included in this invention.

We claim:

1. A non-volatile semiconductor memory comprising:
a plurality of basic blocks each having a plurality of non-volatile memory cells connected in series;
each of said memory cells having a pair of source and drain regions formed on the surface area of a semiconductor substrate and sandwiching a channel region therebetween;
a floating gate formed above said channel region and being capable of charging electric charges; and
a control gate formed above said floating gate,
said floating gate covering a portion of said channel region such that a floating gate transistor is formed with said floating gate and said control gate being positioned above said channel region, and an enhancement type transistor is formed with only said control gate being positioned above said channel region, said floating gate transistor and said enhancement type transistor being electrically connected in parallel with each other,
wherein said floating gate is displaced in a widthwise direction of said channel region to partially cover from substantially the center of said channel region to one of the side lines thereof in said widthwise direction, and
wherein for one of said memory cells, said floating gate is displaced in one widthwise direction of said channel region to partially cover from substantially the center of said channel region to one of the side lines thereof in one of the widthwise directions, and
for memory cells other than said one of the memory cells, said floating gate is displaced in a widthwise direction other than said one of the widthwise direction of said channel region to partially cover from substantially the center of said channel region to the other of the side lines thereof in the other widthwise direction.

2. A memory according to claim 1, wherein said plurality of memory cells in each of said basic blocks are divided into a plurality of cell groups each comprising a predetermined number of memory cells, the floating gates of memory cells belonging to a same cell group are displaced in a same direction, and the floating gates of memory cells not belonging to the same cell group are displaced in a direction opposite to that of the same direction.

3. A memory according to claim 1, wherein an erase operation is performed by causing a current to flow between said floating gate and an erase gate formed between said floating gate and said control gate.

4. A memory according to claim 1, wherein said plurality of basic blocks are connected in parallel in a predetermined number of units.

5. A memory according to claim 1, wherein a silicon nitride film is formed between said floating gate and said control gate.

6. A memory according to claim 1, wherein those basic blocks disposed laterally are separated by a field oxide film.

7. A memory cell according to claim 2, wherein said predetermined number of memory cells is one.

8. A memory cell according to claim 2, wherein said predetermined number of memory cells is two or more.

* * * * *